US012525559B2

(12) United States Patent
Kim et al.

(10) Patent No.: US 12,525,559 B2
(45) Date of Patent: Jan. 13, 2026

(54) SEMICONDUCTOR PACKAGES INCLUDING DIRECTLY BONDED PADS

(71) Applicant: Samsung Electronics Co., Ltd., Suwon-si (KR)

(72) Inventors: Minki Kim, Suwon-si (KR); Seungduk Baek, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 538 days.

(21) Appl. No.: 17/934,298

(22) Filed: Sep. 22, 2022

(65) Prior Publication Data

US 2023/0163089 A1    May 25, 2023

(30) Foreign Application Priority Data

Nov. 25, 2021    (KR) .................. 10-2021-0164691

(51) Int. Cl.
*H01L 23/00*    (2006.01)
*H01L 23/48*    (2006.01)
*H01L 25/065*    (2023.01)

(52) U.S. Cl.
CPC ............ *H01L 24/08* (2013.01); *H01L 23/481* (2013.01); *H01L 24/05* (2013.01); *H01L 24/06* (2013.01); *H01L 25/0652* (2013.01); *H01L 25/0657* (2013.01); *H01L 2224/05009* (2013.01); *H01L 2224/05017* (2013.01);
(Continued)

(58) Field of Classification Search
CPC ......... H01L 23/481; H01L 2224/05017; H01L 2224/05557; H01L 21/76898; H01L 2225/107; H01L 24/08; H01L 24/05; H01L 24/06; H01L 25/0652; H01L 25/0657; H01L 2224/05009; H01L 2224/0603; H01L 2224/06102; H01L 2224/08145

See application file for complete search history.

(56) References Cited

U.S. PATENT DOCUMENTS 8,716,105 B2    5/2014 Sadaka et al.
8,802,538 B1    8/2014 Liu et al.
(Continued)

FOREIGN PATENT DOCUMENTS

KR    20140063271 A    5/2014
KR    20210018633 A    2/2021
KR    20210107592 A    9/2021

*Primary Examiner* — Mamadou L Diallo
(74) *Attorney, Agent, or Firm* — Wolf, Greenfield & Sacks, P.C.

(57) ABSTRACT

A semiconductor package may include a first semiconductor chip and a second semiconductor chip on a top surface thereof. The first semiconductor chip may include a first bonding pad on a top surface of a first semiconductor substrate and a first penetration via on a bottom surface of the first bonding pad and penetrating the first semiconductor substrate. The second semiconductor chip may include a second interconnection pattern on a bottom surface of a second semiconductor substrate and a second bonding pad on a bottom surface of the second interconnection pattern and coupled to the second interconnection pattern. The second bonding pad may be directly bonded to the first bonding pad. A width of the first penetration via may be smaller than that of the first bonding pad, and a width of the second interconnection pattern may be larger than that of the second bonding pad.

20 Claims, 22 Drawing Sheets

(52) U.S. Cl.
CPC ............... *H01L 2224/05018* (2013.01); *H01L 2224/05073* (2013.01); *H01L 2224/05166* (2013.01); *H01L 2224/05181* (2013.01); *H01L 2224/05541* (2013.01); *H01L 2224/05557* (2013.01); *H01L 2224/05558* (2013.01); *H01L 2224/05576* (2013.01); *H01L 2224/05647* (2013.01); *H01L 2224/0603* (2013.01); *H01L 2224/06102* (2013.01); *H01L 2224/08121* (2013.01); *H01L 2224/08145* (2013.01); *H01L 2224/08225* (2013.01); *H01L 2225/06527* (2013.01); *H01L 2225/06544* (2013.01); *H01L 2924/1431* (2013.01); *H01L 2924/1434* (2013.01)

(56) References Cited

U.S. PATENT DOCUMENTS

| | | |
|---|---|---|
| 8,890,276 B2 | 11/2014 | Chapelon |
| 9,093,350 B2 | 7/2015 | Endo et al. |
| 9,679,867 B2 | 6/2017 | Ashidate et al. |
| 9,953,941 B2 | 4/2018 | Enquist |
| 10,825,794 B2 | 11/2020 | Lin et al. |
| 11,011,494 B2 | 5/2021 | Gao et al. |
| 11,664,316 B2 | 5/2023 | Lee et al. |
| 2014/0141569 A1 | 5/2014 | Jo et al. |
| 2015/0097022 A1 | 4/2015 | Di Cioccio et al. |
| 2019/0273108 A1* | 9/2019 | Sato ................. H10F 39/809 |
| 2020/0135699 A1* | 4/2020 | Hwang ................. H01L 25/18 |
| 2021/0082873 A1* | 3/2021 | Chen ................. H01L 23/53257 |
| 2021/0159215 A1* | 5/2021 | Wu ................. H01L 24/09 |
| 2023/0361101 A1* | 11/2023 | Park ................. H01L 24/08 |

* cited by examiner

SEMICONDUCTOR PACKAGES INCLUDING DIRECTLY BONDED PADS

CROSS-REFERENCE TO RELATED APPLICATIONS

This U.S. non-provisional patent application claims priority under 35 U.S.C. § 119 to Korean Patent Application No. 10-2021-0164691, filed on Nov. 25, 2021, in the Korean Intellectual Property Office, the entire contents of which are hereby incorporated by reference.

BACKGROUND OF THE INVENTION

The present disclosure relates to a semiconductor package, and in particular, to a semiconductor package including bonding pads, which are directly bonded to each other.

A semiconductor package is configured to use a semiconductor chip as a part of an electronic product. In general, the semiconductor package may include a printed circuit board (PCB) and a semiconductor chip, which is mounted on the PCB and is electrically connected to the PCB using bonding wires or bumps. With development of the electronic industry, many studies are being conducted to improve reliability and durability of the semiconductor package.

SUMMARY

An embodiment of the inventive concept provides a semiconductor package with improved reliability, durability, and electrical characteristics.

According to an embodiment of the inventive concept, a semiconductor package may include a first semiconductor chip and a second semiconductor chip on a top surface of the first semiconductor chip. The first semiconductor chip may include a first semiconductor substrate, a first bonding pad on a top surface of the first semiconductor substrate, and a first penetration via on a bottom surface of the first bonding pad and penetrating the first semiconductor substrate. The second semiconductor chip may include a second semiconductor substrate, a second interconnection pattern on a bottom surface of the second semiconductor substrate, and a second bonding pad on a bottom surface of the second interconnection pattern and coupled to the second interconnection pattern. The second bonding pad may be directly bonded to the first bonding pad. A width of the first penetration via may be smaller than a width of the first bonding pad, and a width of the second interconnection pattern may be larger than a width of the second bonding pad.

According to an embodiment of the inventive concept, a semiconductor package may include a first substrate, a first pad on a top surface of the first substrate, a first conductive pattern in contact with a bottom surface of the first pad, and a semiconductor chip on the top surface of the first substrate. The semiconductor chip may include a semiconductor substrate, an interconnection layer on a bottom surface of the semiconductor substrate, the interconnection layer including an interconnection pattern, and a bonding pad coupled to a bottom surface of the interconnection pattern. The bonding pad may be directly bonded to the first pad. A width of the interconnection pattern may be larger than a width of the bonding pad, and a width of the first conductive pattern may be smaller than a width of the first pad.

According to an embodiment of the inventive concept, a semiconductor package may include a first semiconductor chip and a second semiconductor chip on a top surface of the first semiconductor chip. The first semiconductor chip may include a first semiconductor substrate, first integrated circuits on a bottom surface of the first semiconductor substrate, a first interconnection layer on the bottom surface of the first semiconductor substrate, the first interconnection layer including a first insulating layer and a first interconnection structure, a first back-side insulating layer on a top surface of the first semiconductor substrate, a first penetration via in the first semiconductor substrate and electrically connected to the first interconnection structure, and a first bonding pad on a top surface of the first penetration via and in the first back-side insulating layer and coupled to the first penetration via. The second semiconductor chip may include a second semiconductor substrate, second integrated circuits on a bottom surface of the second semiconductor substrate, a second interconnection layer on the bottom surface of the second semiconductor substrate, the second interconnection layer including a second insulating layer, a second interconnection structure, and a second interconnection pattern, and a second bonding pad in contact with a bottom surface of the second interconnection pattern. The second bonding pad may be directly bonded to the first bonding pad, and the second insulating layer may be directly bonded to the first back-side insulating layer. A width of the bottom surface of the second interconnection pattern may be larger than a width of a bottom surface of the second bonding pad, and a width of a top surface of the first bonding pad may be larger than a width of the first penetration via.

DETAILED DESCRIPTION

Figure 1A:
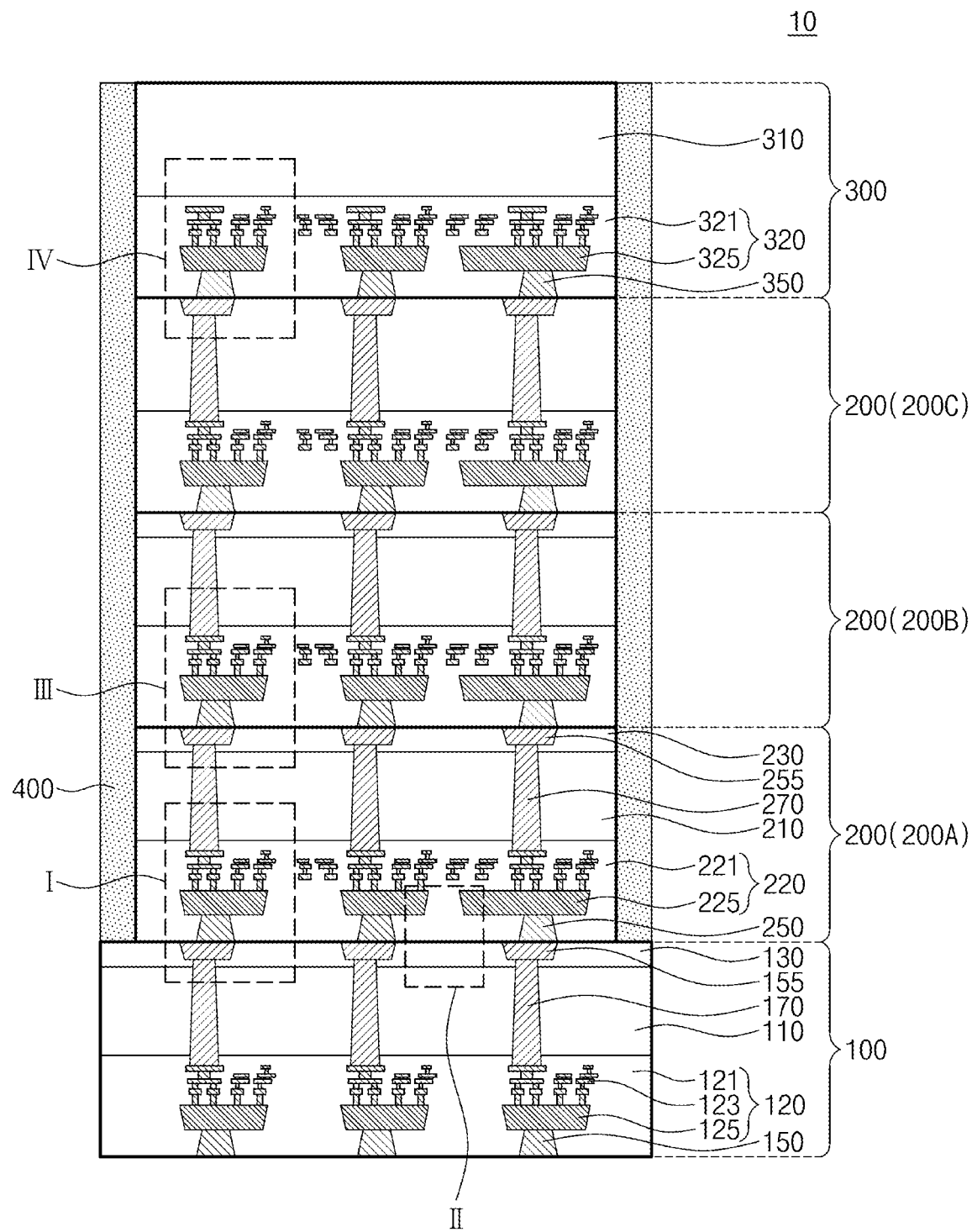
FIG. 1A is a diagram illustrating a semiconductor package according to an embodiment of the inventive concept.

Example embodiments of the inventive concept will now be described more fully with reference to the accompanying drawings, in which example embodiments are shown. Like reference numerals in the drawings denote like elements, and thus their repeated description may be omitted in the interest of brevity.

FIG. 1A is a diagram illustrating a semiconductor package according to an embodiment of the inventive concept.

Referring to FIG. 1A, a semiconductor package may be a chip stack 10. The chip stack 10 may include a first semiconductor chip 100 and a second semiconductor chip 200.

The first semiconductor chip 100 may be, for example, a logic chip or a buffer chip. The first semiconductor chip 100 may be configured to control the second semiconductor chip 200. The first semiconductor chip 100 may include a first substrate, a first interconnection layer 120, first conductive pads 150, first penetration vias 170, a first back-side insulating layer 130, and first bonding pads 155. The first substrate may be a first semiconductor substrate 110. The first interconnection layer 120 may include a first insulating layer 121, first interconnection structures 123, and first interconnection patterns 125. The first penetration vias 170 may be first conductive patterns.

The second semiconductor chip 200 may be provided on the first semiconductor chip 100. The second semiconductor chip 200 may have a size different from the first semiconductor chip 100. For example, a width of the second semiconductor chip 200 may be smaller than a width of the first semiconductor chip 100. The second semiconductor chip 200 may be of a different kind from the first semiconductor chip 100. For example, the second semiconductor chip 200 may be a memory chip. The memory chip may be a high bandwidth memory (HBM) chip. The second semiconductor chip 200 may include a plurality of stacked second semiconductor chips 200. For example, the second semiconductor chips 200 may include a second lower semiconductor chip 200A, a second intermediate semiconductor chip 200B, a second upper semiconductor chip 200C which are stacked. The second semiconductor chips 200 may have the same size. The second semiconductor chips 200 may be of the same kind. Each of the second semiconductor chips 200 may include a second semiconductor substrate 210, a second interconnection layer 220, second bonding pads 250, second penetration vias 270, a second back-side insulating layer 230, and second upper bonding pads 255. The second interconnection layer 220 may include a second insulating layer 221 and second interconnection patterns 225. The number of the second semiconductor chips 200 may be variously modified from that in the illustrated example. As an example, the chip stack 10 may be configured to include one second semiconductor chip 200. The description that follows will refer to an example in which just one second semiconductor chip 200 is provided, for convenience in description.

The chip stack 10 may further include a third semiconductor chip 300. The third semiconductor chip 300 may be provided on the second semiconductor chip 200. For example, the third semiconductor chip 300 may be provided on the second upper semiconductor chip 200C. The third semiconductor chip 300 may be the uppermost semiconductor chip. The third semiconductor chip 300 may have the same or substantially the same width as the second semiconductor chip 200. A height or thickness of the third semiconductor chip 300 may be larger than a height or thickness of the second semiconductor chip 200. In an embodiment, the third semiconductor chip 300 may be of the same kind as the second semiconductor chip 200. For example, the third semiconductor chip 300 may be a high bandwidth memory (HBM) chip. The third semiconductor chip 300 may include a third semiconductor substrate 310, a third interconnection layer 320, and third bonding pads 350. The third semiconductor chip 300 may not include a third penetration via, a third back-side insulating layer, and a third upper bonding pad. The third interconnection layer 320 may include a third insulating layer 321 and third interconnection patterns 325.

The chip stack 10 may further include a first mold layer 400. The first mold layer 400 may be provided on a top surface of the first semiconductor chip 100. The first mold layer 400 may cover or surround the top surface of the first semiconductor chip 100, a side surface of the second semiconductor chip 200, and a side surface of the third semiconductor chip 300. The first mold layer 400 may expose a top surface of the third semiconductor chip 300. The first mold layer 400 may include an insulating polymer (e.g., an epoxy-based molding compound).

Hereinafter, the first semiconductor chip will be described in more detail.

Figure 1B:
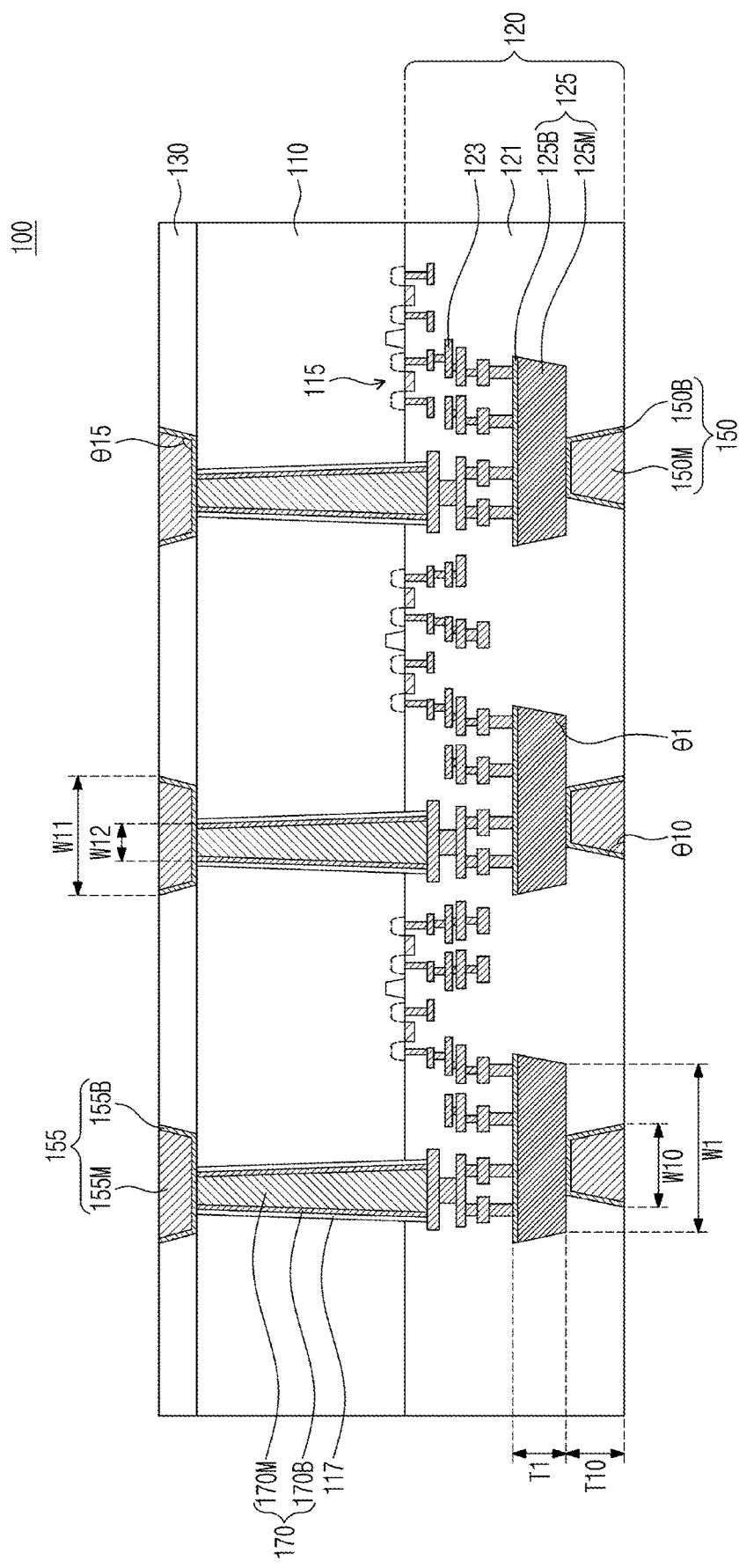
FIG. 1B is a diagram illustrating a first semiconductor chip according to an embodiment of the inventive concept.

FIG. 1B is a diagram illustrating a first semiconductor chip according to an embodiment of the inventive concept.

Referring to FIGS. 1A and 1B, the first semiconductor chip 100 may further include first integrated circuits 115, in addition to the first semiconductor substrate 110, the first interconnection layer 120, the first conductive pads 150, the first penetration vias 170, the first back-side insulating layer 130, and the first bonding pads 155.

The first semiconductor substrate 110 may be formed of or include a semiconductor material (e.g., silicon, germanium, or silicon germanium). A bottom surface of the first semiconductor substrate 110 may be a front surface, and a top surface of the first semiconductor substrate 110 may be a rear surface. The first integrated circuits 115 may be provided on the bottom surface of the first semiconductor substrate 110. The first integrated circuits 115 may include, for example, transistors. The first interconnection layer 120 may be provided on the bottom surface of the first semiconductor substrate 110. The first interconnection layer 120 may include a front-end-of-line (FEOL) layer and a back-end-of-line (BEOL) layer. The FEOL layer of the first interconnection layer 120 may be provided between the first semiconductor substrate 110 and the BEOL layer of the first interconnection layer 120. The first insulating layer 121 may be provided on the bottom surface of the first semiconductor substrate 110 to cover the first integrated circuits 115. The first insulating layer 121 may include a plurality of layers. The first insulating layer 121 may include a silicon-containing insulating material. For example, the silicon-containing insulating material may include silicon oxide, silicon nitride, silicon oxynitride, silicon carbon oxide, silicon carbonitride, and/or tetraethyl orthosilicate. The first interconnection structures 123 may be provided in the first insulating layer 121. The first interconnection structures 123 may be electrically connected to the first integrated circuits 115. The expression "an element is electrically connected to a semiconductor chip" may mean that the element is electrically connected to integrated circuits of the semiconductor chip. In the present specification, the expression "two elements are electrically connected to each other" may mean that the elements are directly connected to each other or are indirectly connected to each other through other conductive elements. The first interconnection structures 123 may include first interconnection lines and first vias, which are connected to the first interconnection lines. The first vias may be provided between the first interconnection lines. The first interconnection lines and the first vias may be formed of or include at least one metallic material.

The first conductive pads 150 may be provided on a bottom surface of the first interconnection layer 120. For example, the first conductive pads 150 may be provided in the first interconnection layer 120, but bottom surfaces of the first conductive pads 150 may be exposed to the outside of the first insulating layer 121. A bottom surface of the first semiconductor chip 100 may include the bottom surface of the first interconnection layer 120 and the bottom surfaces of the first conductive pads 150. The first conductive pads 150 may be provided on bottom surfaces of the first interconnection patterns 125, respectively.

Each of the first conductive pads 150 may have an inclined side surface. An angle θ10 between bottom and side surfaces of the first conductive pad 150 may be an acute angle. An angle between side and top surfaces of the first conductive pads 150 may be an obtuse angle. A width W10 of the bottom surface of each of the first conductive pads 150 may be larger than a width of the top surface thereof. The width W10 of the bottom surface of each of the first conductive pads 150 may range from 1 μm to 6 μm. The width of each of the first conductive pads 150 may increase in a direction from its top surface to its bottom surface.

Each of the first conductive pads 150 may include a lower metal pad or a lower metal pad portion 150M and a lower barrier pad or a lower barrier pad portion 150B. The lower barrier pad 150B may be provided on top and side surfaces of the lower metal pad 150M. The lower barrier pad 150B may be formed of or include at least one of titanium, tantalum, and/or alloys thereof. The lower metal pad 150M may be formed of or include, for example, copper. A thermal expansion coefficient of the lower metal pad 150M may range from 5 ppm/K to 18 ppm/K.

The first interconnection patterns 125 may be provided on the top surfaces of the first conductive pads 150. For example, the first interconnection patterns 125 may be in direct contact with the top surfaces of the first conductive pads 150. The first interconnection patterns 125 may be provided between the first conductive pads 150 and the first interconnection structures 123 and may be electrically connected to the first conductive pads 150 and the first interconnection structures 123. The first interconnection patterns 125 may correspond to the lowermost interconnection lines of the first insulating layer 121. As an example, the first interconnection patterns 125 may correspond to the lowermost interconnection lines of the BEOL layer. The first interconnection patterns 125 may be laterally spaced apart from each other. The expression "elements are laterally spaced apart from each other" means that the elements are horizontally spaced apart from each other. Here, the term "horizontal" refers to a direction parallel to the top surface of the first semiconductor substrate 110. Each of the first interconnection patterns 125 may have an inclined side surface. For example, an angle θ1 between bottom and side surfaces of each of the first interconnection patterns 125 may be an obtuse angle. An angle between side and top surfaces of each of the first interconnection patterns 125 may be an acute angle. The bottom surface of each of the first interconnection patterns 125 may have a first width W1. A width of the top surface of each of the first interconnection patterns 125 may be larger than the first width W1. As an example, a width of each of the first interconnection patterns 125 may increase in a direction from its bottom surface toward its top surface. The width of the first interconnection pattern 125 may be larger than widths of the bottom surfaces of the first conductive pads 150. For example, the first width W1 may be larger than a corresponding one of the widths W10 of the bottom surfaces of the first conductive pads 150. Accordingly, the bottom surfaces of the first conductive pads 150 may be vertically overlapped or aligned with the first interconnection patterns 125. Here, the term "vertical" refers to a direction perpendicular to the top surface of the first semiconductor substrate 110.

Each of the first interconnection patterns 125 may have a first thickness T1. The first thickness T1 may be 0.5 to 1.5 times a thickness T10 of the first conductive pads 150. The first thickness T1 may be larger than thicknesses of the first interconnection lines of the first interconnection structures 123. In an embodiment, the first thickness T1 may range from 1 μm to 5 μm.

Each of the first interconnection patterns 125 may include a first barrier layer 125B and a first metal line 125M. The first barrier layer 125B may be provided on a top surface of the first metal line 125M. The first barrier layer 125B may be formed of or include at least one of titanium, tantalum, and/or alloys thereof. A thickness of the first barrier layer 125B may be smaller than a thickness of the first metal line 125M. The first metal line 125M may include a metallic material (metallic element) different from the lower metal pad 150M. The first metal line 125M may be formed of or include aluminum, tin, and/or zinc.

The first interconnection patterns 125 may have a thermal expansion coefficient greater than that of the first conductive pads 150. For example, the thermal expansion coefficient of the first metal line 125M may be greater than the thermal expansion coefficient of the lower metal pad 150M. The thermal expansion coefficient of the first metal line 125M may be greater than 18 ppm/K and may be smaller than or equal to 50 ppm/K.

Conductive patterns may be provided in the first semiconductor substrate 110. The conductive patterns may be the first penetration vias 170. In an embodiment, the first penetration vias 170 may be provided to penetrate the first semiconductor substrate 110 completely in a vertical direction. The first penetration vias 170 may further penetrate an upper portion of the first insulating layer 121. For example, the first insulating layer 121 may include a plurality of layers, and the first penetration vias 170 may further penetrate at least one of the plurality of layers. The first penetration vias 170 may be coupled to the first interconnection structures 123. The first penetration vias 170 may be electrically connected to the first integrated circuits 115 through the first interconnection structures 123. The first penetration vias 170 may be electrically connected to the first interconnection patterns 125 and the first conductive pads 150.

Each of the first penetration vias 170 may include a first via barrier layer 170B and a first conductive via 170M. The first conductive via 170M may be disposed on an inner side surface of the first via barrier layer 170B. The first conductive via 170M may be formed of or include at least one metallic material (e.g., copper or tungsten). The first via barrier layer 170B may be provided along a side surface of the first conductive via 170M. For example, the first via barrier layer 170B may be provided between the first conductive via 170M and the first semiconductor substrate 110, between the first conductive via 170M and the first back-side insulating layer 130, and between the first conductive via 170M and the first insulating layer 121. The first via barrier layer 170B may not cover top and bottom surfaces of the first conductive via 170M. The first via barrier layer 170B may be formed of or include at least one of titanium, tantalum, and/or alloys thereof. The first via barrier layer 170B may prevent a material, which is contained in the first conductive via 170M, from being diffused. The first via barrier layer 170B may be used as a seed layer in a process of forming the first conductive via 170M.

The first semiconductor chip 100 may further include a first liner layer 117. The first liner layer 117 may be provided between the first via barrier layer 170B and the first semiconductor substrate 110. In an embodiment, the first liner layer 117 may be further extended into regions between the first via barrier layer 170B and the first back-side insulating layer 130 and between the first via barrier layer 170B and the first insulating layer 121.

The first back-side insulating layer 130 may be provided on the top surface of the first semiconductor substrate 110. The first back-side insulating layer 130 may be a single layer or may include a plurality of layers. The first back-side insulating layer 130 may be formed of or include at least one of silicon-based insulating materials. In an embodiment, the first penetration vias 170 may be partially inserted into a lower portion of the first back-side insulating layer 130.

The first bonding pads 155 may be provided on the top surface of the first semiconductor chip 100. The top surface of the first semiconductor chip 100 may include top surfaces of the first bonding pads 155 and a top surface of the first back-side insulating layer 130. The first bonding pads 155 may be provided on the first penetration vias 170 and in the first back-side insulating layer 130. The first bonding pads 155 may be electrically connected to the first penetration vias 170. The first bonding pads 155 may be in direct contact with the first penetration vias 170. Accordingly, it may be possible to simplify a fabrication process of the first semiconductor chip 100 and to reduce a size of the first semiconductor chip 100. Widths of the first bonding pads 155 may be larger than widths of the first penetration vias 170. For example, a width W11 of a top surface of each of the first bonding pads 155 may be larger than a width W12 of a top surface of the first penetration via 170, which is electrically connected thereto. Each of the first bonding pads 155 may have an inclined side surface. For example, an angle θ15 between bottom and side surfaces of each of the first bonding pads 155 may be an obtuse angle. An angle between side and top surfaces of each of the first bonding pads 155 may be an acute angle. The width W11 of the top surface of each of the first bonding pads 155 may be larger than a width of the bottom surface thereof. For example, the width W11 of the top surface of each of the first bonding pads 155 may range from 5 μm to 20 μm.

Each of the first bonding pads 155 may include a first metal pad or a first metal pad portion 155M and a first barrier pad or a first barrier pad portion 155B. The first barrier pad 155B may cover bottom and side surfaces of the first metal pad 155M. The first barrier pad 155B may be formed of or include at least one of titanium, tantalum, and/or alloys thereof. The first metal pad 155M may be formed of or include, for example, copper. As an example, the first metal pad 155M may be formed of or include the same metallic material as the first conductive via 170M, but the inventive concept is not limited to this example. A thermal expansion coefficient of the first metal pad 155M may range from 5 ppm/K to 18 ppm/K.

Hereinafter, the second semiconductor chip will be described in more detail. The description that follows will refer to an example in which one second semiconductor chip is provided, for convenience in description.

Figure 1C:
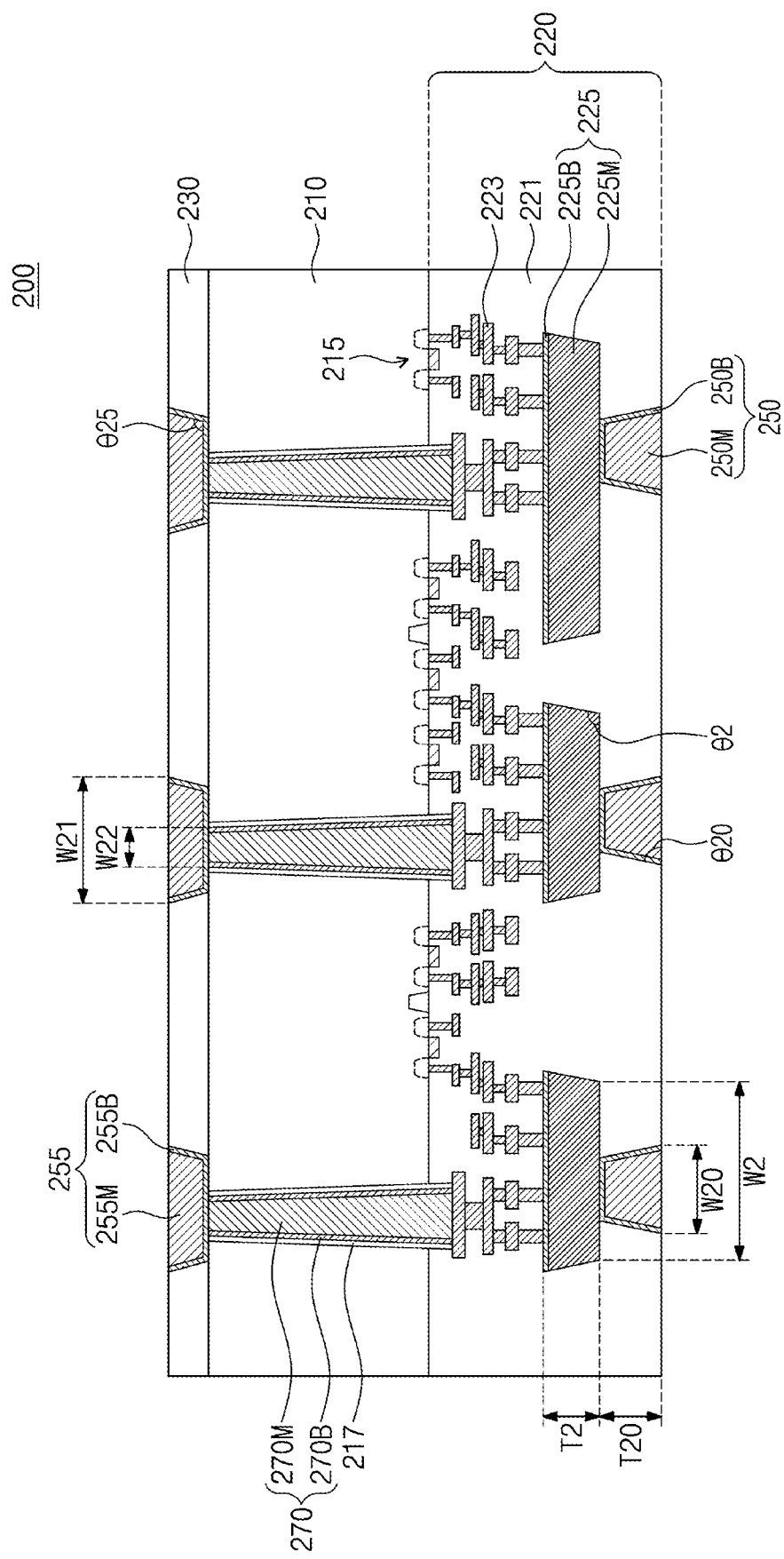
FIG. 1C is a diagram illustrating a second semiconductor chip according to an embodiment of the inventive concept.

FIG. 1C is a diagram illustrating a second semiconductor chip according to an embodiment of the inventive concept.

Referring to FIG. 1C, the second semiconductor chip 200 may further include second integrated circuits 215, in addition to the second semiconductor substrate 210, the second interconnection layer 220, the second bonding pads 250, the second penetration vias 270, the second back-side insulating layer 230, and the second upper bonding pads 255. The second semiconductor chip 200 may be the second lower semiconductor chip 200A, the second intermediate semiconductor chip 200B, or the second upper semiconductor chip 200C previously described with reference to FIG. 1A. The second semiconductor substrate 210 may be formed of or include a semiconductor material (e.g., silicon, germanium, or silicon germanium). A bottom surface of the second semiconductor substrate 210 may be a front surface, and a top surface of the second semiconductor substrate 210 may be a rear surface. The second integrated circuits 215 may be provided on the bottom surface of the second semiconductor substrate 210. The second integrated circuits 215 may include, for example, transistors.

The second interconnection layer 220 may be provided on the bottom surface of the second semiconductor substrate 210. The second interconnection layer 220 may include an FEOL layer and a BEOL layer. The FEOL layer of the second interconnection layer 220 may be provided between the second semiconductor substrate 210 and the BEOL layer of the second interconnection layer 220. The second interconnection layer 220 may include the second insulating layer 221, the second interconnection patterns 225, and second interconnection structures 223. The second insulating layer 221 may be provided on the bottom surface of the second semiconductor substrate 210 to cover the second integrated circuits 215. The second insulating layer 221 may include a plurality of layers. The second insulating layer 221 may include a silicon-containing insulating material. The second interconnection structures 223 may be provided in the second insulating layer 221. The second interconnection structures 223 may be electrically connected to the second integrated circuits 215. The second interconnection structures 223 may include second interconnection lines and second vias. The second vias may be provided between the second interconnection lines and may be coupled to the second interconnection lines. The second interconnection lines and the second vias may be formed of or include at least one metallic material.

The second interconnection patterns 225 may correspond to the lowermost interconnection lines of the second insulating layer 221. As an example, the second interconnection patterns 225 may correspond to the lowermost interconnection lines of the BEOL layer. The second interconnection patterns 225 may be laterally spaced apart from each other. Each of the second interconnection patterns 225 may have an inclined side surface. For example, an angle θ2 between bottom and side surfaces of each of the second interconnection patterns 225 may be an obtuse angle. An angle between side and top surfaces of each of the second interconnection patterns 225 may be an acute angle. The bottom surface of each of the second interconnection patterns 225 may have a second width W2. A width of the top surface of each of the second interconnection patterns 225 may be larger than the second width W2. As an example, a width of each of the second interconnection patterns 225 may increase in a direction from its bottom surface toward its top surface. A second thickness T2 of the second interconnection patterns 225 may be relatively large. For example, the second thickness T2 may be larger than thicknesses of the second interconnection lines of the second interconnection structures 223. In an embodiment, the second thickness T2 may range from 1 μm to 5 μm.

Each of the second interconnection patterns 225 may include a second barrier layer 225B and a second metal line 225M. The second barrier layer 225B may be provided on a top surface of the second metal line 225M. The second barrier layer 225B may be formed of or include at least one of titanium, tantalum, and/or alloys thereof. A thickness of the second barrier layer 225B may be smaller than a thickness of the second metal line 225M. The second metal line 225M may be formed of or include at least one of aluminum, tin, and/or zinc. A thermal expansion coefficient of the second metal line 225M may be greater than 18 ppm/K and may be smaller than or equal to 50 ppm/K.

The second bonding pads 250 may be provided near a bottom surface of the second interconnection layer 220. For example, the second bonding pads 250 may be provided in the second interconnection layer 220. Here, the second insulating layer 221 may be provided to expose bottom surfaces of the second bonding pads 250. A bottom surface of the second semiconductor chip 200 may include the bottom surface of the second interconnection layer 220 and the bottom surfaces of the second bonding pads 250. The bottom surface of the second interconnection layer 220 may include a bottom surface of the second insulating layer 221. The second interconnection patterns 225 may be provided on top surfaces of the second bonding pads 250. For example, the second interconnection patterns 225 may be in direct contact with the top surfaces of the second bonding pads 250. The second bonding pads 250 may be electrically connected to the second integrated circuits 215 through the second interconnection patterns 225 and the second interconnection structures 223.

An angle θ20 between the bottom and side surfaces of the second bonding pad 250 may be an acute angle. An angle between side and top surfaces of the second bonding pads 250 may be an obtuse angle. A width W20 of the bottom surface of each of the second bonding pads 250 may be larger than a width of the top surface thereof. As an example, a width of each of the second bonding pads 250 may increase in a direction from its top surface toward its bottom surface. The widths of the second bonding pads 250 may be smaller than the second width W2. For example, the width W20 of the bottom surface of each of the second bonding pads 250 may be smaller than the second width W2. The width W20 of the bottom surface of each of the second bonding pads 250 may range from 1 μm to 6 μm. Accordingly, the bottom surface of each of the second bonding pads 250 may be vertically overlapped or aligned with the second interconnection patterns 225, which are connected thereto.

Each of the second bonding pads 250 may include a second metal pad or a second metal pad portion 250M and a second barrier pad or a second barrier pad portion 250B. The second barrier pad 250B may be provided on top and side surfaces of the second metal pad 250M. The second barrier pad 250B may be formed of or include at least one of titanium, tantalum, and/or alloys thereof. The second metal pad 250M may include a metallic material (metallic element) different from that of the second metal line 225M. The second metal pad 250M may be formed of or include, for example, copper.

A thermal expansion coefficient of the second interconnection patterns 225 may be greater than a thermal expansion coefficient of the second bonding pads 250. A thermal expansion coefficient of the second metal line 225M may be greater than a thermal expansion coefficient of the second metal pad 250M. For example, the thermal expansion coefficient of the second metal pad 250M may range from 5 ppm/K to 18 ppm/K.

The second thickness T2 may be 0.5 to 1.5 times a thickness T20 of the second bonding pad 250.

The second penetration vias 270 may be provided in the second semiconductor substrate 210. For example, the second penetration vias 270 may be provided to penetrate the second semiconductor substrate 210 completely in a vertical direction. The second penetration vias 270 may be partially inserted into an upper portion of the second insulating layer 221. For example, the second insulating layer 221 may include a plurality of layers, and the second penetration vias 270 may further penetrate at least one of the plurality of layers. The second penetration vias 270 may be coupled to the second interconnection patterns 225 through the second interconnection structures 223. Accordingly, each of the second penetration vias 270 may be electrically connected to at least one of the second integrated circuits 215 and the second bonding pads 250.

Each of the second penetration vias 270 may include a second via barrier layer 270B and a second conductive via 270M. The second conductive via 270M may be disposed on an inner side surface of the second via barrier layer 270B. The second conductive via 270M may be formed of or include at least one metallic material (e.g., copper or tungsten). The second via barrier layer 270B may be provided along a side surface of the second conductive via 270M. For example, the second via barrier layer 270B may be provided between the second conductive via 270M and the second semiconductor substrate 210, between the second conductive via 270M and the second back-side insulating layer 230, and between the second conductive via 270M and the second insulating layer 221. The second via barrier layer 270B may not cover top and bottom surfaces of the second conductive via 270M. The second via barrier layer 270B may be formed of or include at least one of titanium, tantalum, or alloys thereof. The second via barrier layer 270B may be used as a seed layer in a process of forming the second conductive via 270M.

The second semiconductor chip 200 may further include a second liner layer 217. The second liner layer 217 may be provided between the second via barrier layer 270B and the second semiconductor substrate 210. The second liner layer 217 may be extended into regions between the second via barrier layer 270B and the second back-side insulating layer 230 and between the second via barrier layer 270B and the second insulating layer 221. However, in an embodiment, the second liner layer 217 may not be provided between the second via barrier layer 270B and the second back-side insulating layer 230 or between the second via barrier layer 270B and the second insulating layer 221.

The second back-side insulating layer 230 may be provided on a top surface of the second semiconductor substrate 210. The second back-side insulating layer 230 may be a single layer or may include a plurality of layers. The second back-side insulating layer 230 may be formed of or include a silicon-based insulating material. In an embodiment, the second penetration vias 270 may be further extended into the second back-side insulating layer 230.

The second upper bonding pads 255 may be provided on the second penetration vias 270 and in the second back-side insulating layer 230. The second upper bonding pads 255 may be electrically connected to the second penetration vias 270. In the case where additional conductive elements (e.g., additional interconnection lines) are interposed between the second upper bonding pads 255 and the second penetration vias 270, a process of fabricating the second semiconductor chip 200 may be complicated. In an embodiment, the second upper bonding pads 255 may be in direct contact with the second penetration vias 270. Accordingly, it may be possible to simplify a fabrication process of the second semiconductor chip 200 and to reduce a size of the second semiconductor chip 200. Widths of the second upper bonding pads 255 may be larger than widths of the second penetration vias 270. For example, a width W21 of the top surface of each of the second bonding pads 250 may be larger than a width W22 of the top surface of the second penetration via 270 connected thereto. For example, the width W21 of the top surface of each of the second bonding pads 250 may range from 5 μm to 20 μm.

The shape and material of the second upper bonding pads 255 may be the same as or similar to those of the first bonding pads 155 in the previous embodiment of FIG. 1B. For example, each of the second bonding pads 250 may have an inclined side surface. As an example, an angle θ25 between bottom and side surfaces of each of the second bonding pads 250 may be an obtuse angle. An angle between side surface and top surface of each of the second bonding pads 250 may be an acute angle. The width W21 of the top surface of each of the second bonding pads 250 may be larger than a width of the bottom surface thereof.

Each of the second upper bonding pads 255 may include a second upper metal pad 255M and a second upper barrier pad 255B. The second upper barrier pad 255B may cover bottom and side surfaces of a second upper metal pad 255M. The second upper barrier pad 255B may include at least one of titanium, tantalum, and/or alloys thereof. The second upper metal pad 255M may be formed of or include, for example, copper. As an example, the second upper metal pad 255M may include the same metallic material as the second conductive via 270M, but the inventive concept is not limited to this example. A thermal expansion coefficient of the second upper metal pad 255M may range from 5 ppm/K to 18 ppm/K.

Hereinafter, a bonding structure between the first and second semiconductor chips will be described in more detail. The description that follows will refer to an example in which a single first bonding pad, a single second bonding pad, and a single second interconnection pattern are provided, for convenience in description.

Figure 1D:
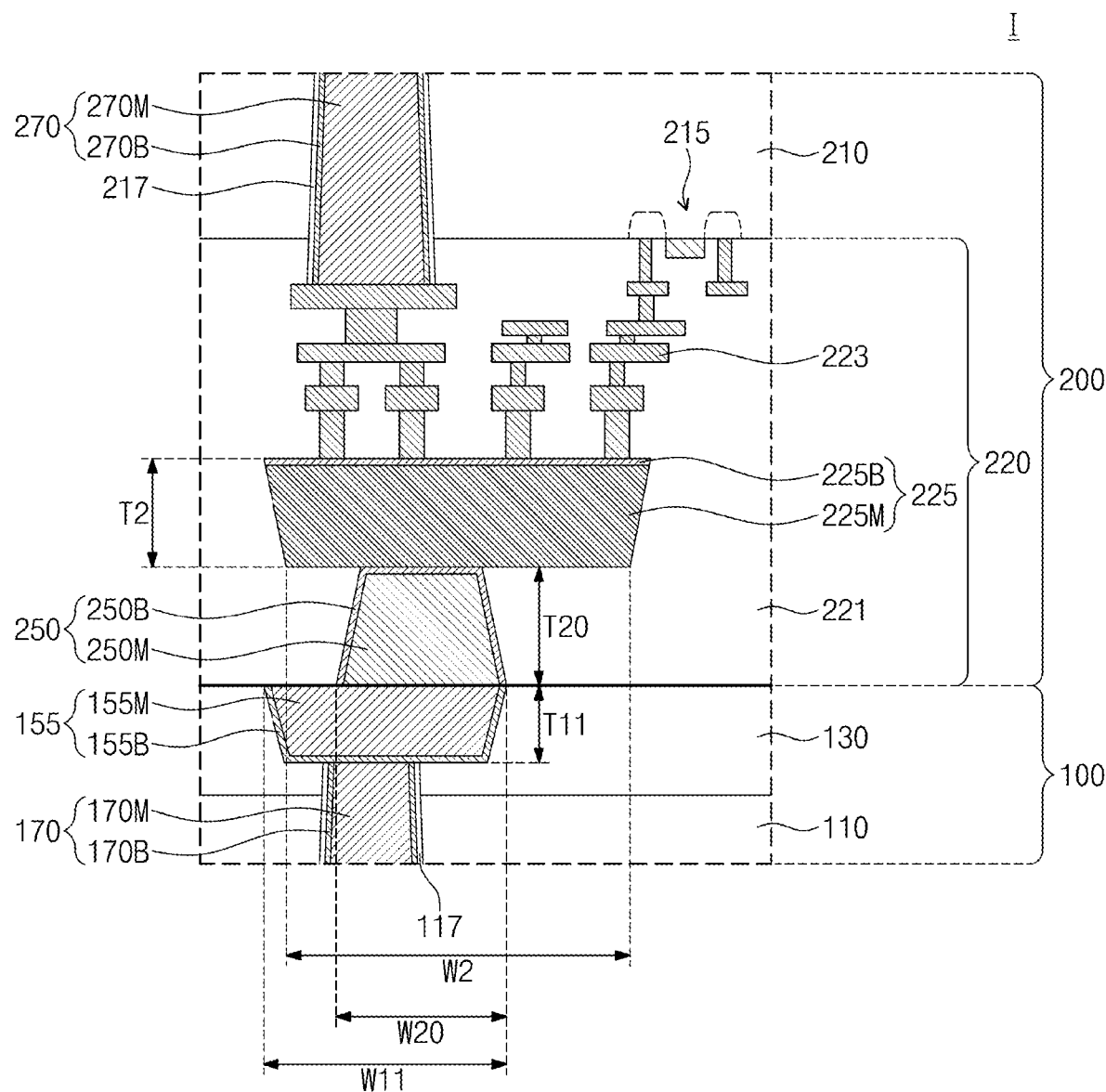
FIG. 1D is an enlarged sectional view illustrating a portion I of FIG. 1A.
Figure 1E:
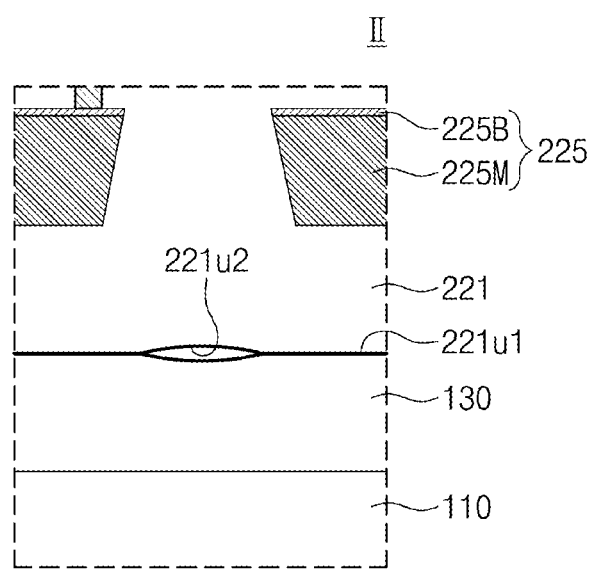
FIG. 1E is an enlarged sectional view illustrating a portion II of FIG. 1A.

FIG. 1D is an enlarged sectional view illustrating a portion I of FIG. 1A. FIG. 1E is an enlarged sectional view illustrating a portion II of FIG. 1A.

Referring to FIGS. 1A and 1D, the second semiconductor chip 200 may be provided on the top surface of the first semiconductor chip 100. The second semiconductor chip 200 may be connected to the first semiconductor chip 100 in a direct bonding manner. For example, the second lower semiconductor chip 200A may be directly bonded to the first semiconductor chip 100. The expressions "two chips are directly bonded to each other or are connected to each other in a direct bonding manner" or "the direct bonding between chips" mean that opposite conductive elements of the two chips are directly bonded to each other and opposite insulating elements of the two chips are directly bonded to each other. The expression "the insulating elements are directly bonded to each other" may mean that a chemical bond is formed between the insulating elements. The direct bonding of the chips may include hybrid bonding of the chips. For example, the second bonding pad 250 of the second lower semiconductor chip 200A may be directly bonded to the first bonding pad 155 of the first semiconductor chip 100. During such a direct bonding process, metal atoms may be diffused from the first bonding pad 155 into the second bonding pad 250 or from the second bonding pad 250 into the first bonding pad 155. In this case, there may be no observable interface between the first bonding pad 155 and the second bonding pad 250.

The second insulating layer 221 of the second lower semiconductor chip 200A may be in direct contact with the first back-side insulating layer 130 of the first semiconductor chip 100 and may be connected to the first back-side insulating layer 130 in a direct bonding manner. For example, chemical bonds may be provided between the second insulating layer 221 and the first back-side insulating layer 130. The chemical bond may be covalent bond. There may be no observable interface between the first back-side insulating layer 130 and the second insulating layer 221.

The direct bonding process of the first semiconductor chip 100 and the second lower semiconductor chip 200A may include providing heat and pressure to the first semiconductor chip 100 and the second lower semiconductor chip 200A. The second interconnection pattern 225 may have a thermal expansion coefficient that is greater than that of the first and second bonding pads 155 and 250. For example, a thermal expansion coefficient of the second metal line 225M may be greater than a thermal expansion coefficient of the second metal pad 250M and a thermal expansion coefficient of the first metal pad 155M. Due to the difference in the thermal expansion coefficient, the second interconnection pattern 225 may exert a force on the second bonding pad 250 during the direct bonding process. The force may be exerted in the form of pressure. Since the thermal expansion coefficient of the second metal line 225M is greater than 18 ppm/K, the second interconnection pattern 225 may exert a sufficiently strong force on the first bonding pad 155 and the second bonding pad 250, during the direct bonding. Accordingly, the second bonding pad 250 may be easily and robustly coupled to the first bonding pad 155.

The second interconnection pattern 225 may be overlapped with a bottom surface of the second bonding pad 250. The bottom surface of the second bonding pad 250 may be a surface that is bonded to the first bonding pad 155. This may make it possible to realize a robust direct bonding structure between the first bonding pad 155 and the second bonding pad 250.

According to an embodiment of the inventive concept, since the second thickness T2 of the second interconnection pattern 225 is larger than 0.5 times the thickness T20 of the second bonding pad 250, the second interconnection pattern 225 may exert a sufficiently strong force on the second bonding pad 250 during the direct bonding process. Accordingly, the first bonding pad 155 and the second bonding pad 250 may be more robustly bonded to each other.

If the second thickness T2 is larger than 1.5 times the thickness T20 of the second bonding pad 250, the second insulating layer 221 may be delaminated from the second interconnection pattern 225, owing to a difference in thermal expansion coefficient between the second interconnection pattern 225 and the second insulating layer 221. In this case, a defect (e.g., a void) may occur between the second insulating layer 221 and the second interconnection pattern 225. According to an embodiment of the inventive concept, since the thickness of the second interconnection pattern 225 is larger than or equal to 1.5 times the thickness of the first bonding pad 155, the second interconnection pattern 225 may be more effectively covered with the second insulating layer 221. Accordingly, the second insulating layer 221 may be prevented from being delaminated from the second interconnection pattern 225. A width of the first bonding pad 155 may be larger than a width of the second bonding pad 250. For example, the width W11 of the top surface of the first bonding pad 155 may be larger than the width W20 of the bottom surface of the second bonding pad 250. Accordingly, even when there is a process error in a process of disposing the second semiconductor chip 200, the bottom surface of the second bonding pad 250 may be in good contact with the first bonding pad 155. As an example, the bottom surface of the second bonding pad 250 may be fully overlapped with the first bonding pad 155. The first bonding pad 155 may have a first top surface or a first top surface portion and a second top surface or a second top surface portion. The first top surface of the first bonding pad 155 may be in contact with the second bonding pad 250 and may be directly bonded to the second bonding pad 250. The second top surface of the first bonding pad 155 may be spaced apart from the second bonding pad 250 and may be in contact with the first insulating layer 121.

A thickness T11 of the first bonding pad 155 may be smaller than a thickness T20 of the second bonding pad 250.

Referring to FIGS. 1A and 1E, the second interconnection patterns 225 may be horizontally spaced apart from each other. The second insulating layer 221 may have a first bottom surface or a first bottom surface portion 221u1, which is vertically overlapped or aligned with the second interconnection patterns 225, and a second bottom surface or a second bottom surface portion 221u2, which is not vertically overlapped or aligned with the second interconnection patterns 225. During the direct bonding process between the first semiconductor chip 100 and the second lower semiconductor chip 200A, a force may be exerted on a boundary between the first bottom surface 221u1 of the second insulating layer 221 and the first back-side insulating layer 130 by the second interconnection patterns 225. The force may be exerted in the form of pressure. Accordingly, a chemical bond may be easily formed between the first bottom surface 221u1 of the second insulating layer 221 and a top surface of the first back-side insulating layer 130. The first bottom surface 221u1 of the second insulating layer 221 may be well bonded to the first back-side insulating layer 130 in the direct bonding manner.

Meanwhile, there may be a difficulty in exerting the force from the second interconnection patterns 225 on the second bottom surface 221u2 of the second insulating layer 221, during the direct bonding process. In this case, the direct bonding structure may not be formed between the second bottom surface 221u2 of the second insulating layer 221 and the first back-side insulating layer 130. As an example, the second bottom surface 221u2 of the second insulating layer 221 may be spaced apart from the top surface of the first back-side insulating layer 130. A void or an air gap may be provided between the second bottom surface 221u2 of the second insulating layer 221 and the first back-side insulating layer 130. As another example, the second bottom surface 221u2 of the second insulating layer 221 may be in contact with the top surface of the first back-side insulating layer 130 but may not be chemically bonded to the top surface of the first back-side insulating layer 130.

Hereinafter, a bonding structure between second semiconductor chips will be described in more detail.

Figure 1F:
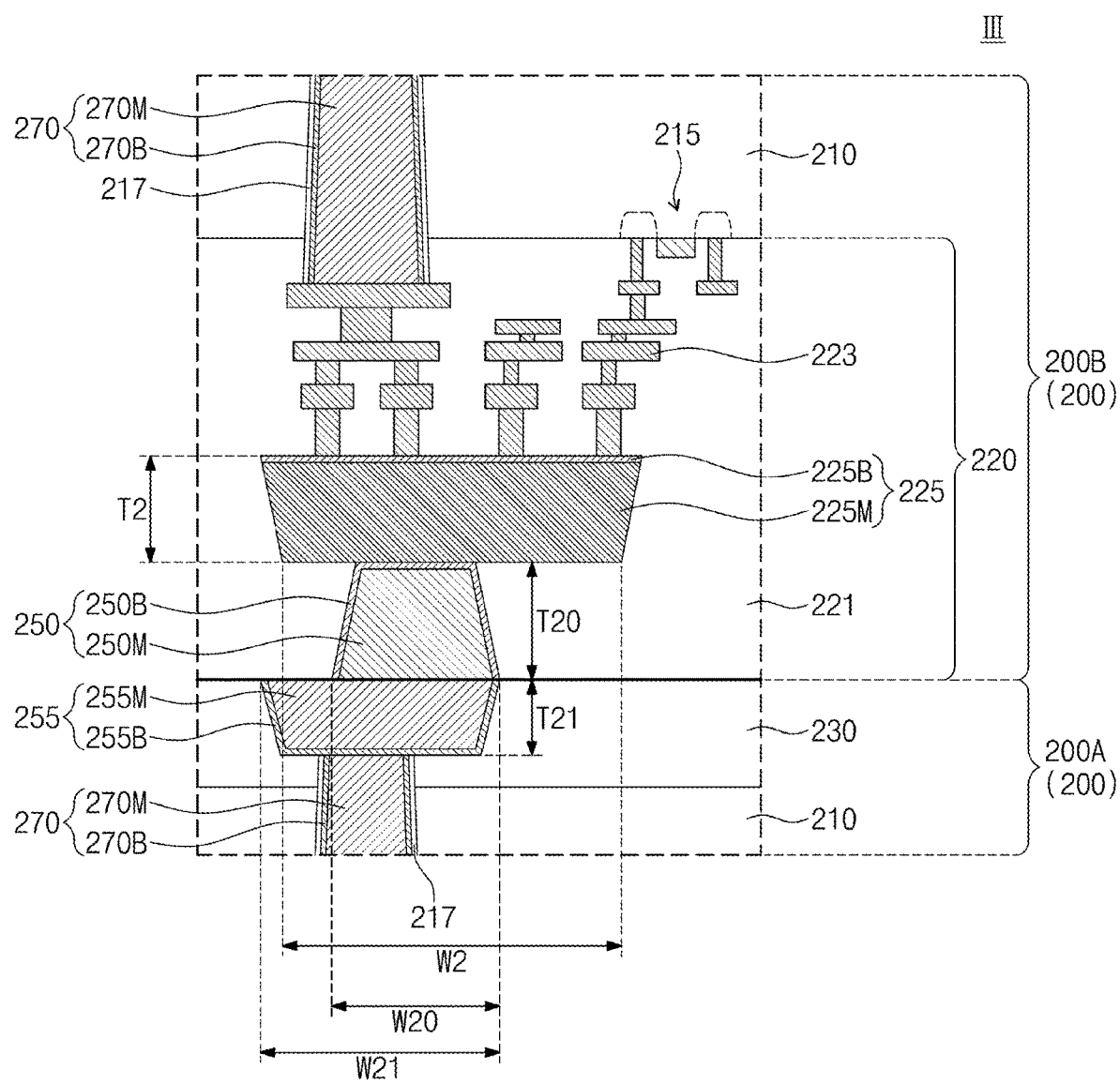
FIG. 1F is an enlarged sectional view illustrating a portion III of FIG. 1A.

FIG. 1F is an enlarged sectional view illustrating a portion III of FIG. 1A.

Referring to FIGS. 1A and 1F, a plurality of the second semiconductor chips 200 may be vertically stacked on the first semiconductor chip 100. The second semiconductor chips 200 may be connected to each other in a direct bonding manner. For example, the second lower semiconductor chip 200A and the second intermediate semiconductor chip 200B may be connected to each other in a direct bonding manner. Each of the second lower semiconductor chip 200A and the second intermediate semiconductor chip 200B may be substantially the same as the second semiconductor chip 200 previously described with reference to FIG. 1B. The second upper bonding pad 255 of the second lower semiconductor chip 200A and the second bonding pad 250 of the second intermediate semiconductor chip 200B may be in direct contact with each other and may be connected to each other in a direct bonding manner. There may be no observable interface between the second upper bonding pad 255 of the second lower semiconductor chip 200A and the second bonding pad 250 of the second intermediate semiconductor chip 200B.

According to an embodiment of the inventive concept, since the second thickness T2 of the second interconnection pattern 225 of the second intermediate semiconductor chip 200B is larger than 0.5 times the thickness T21 of the second upper bonding pad 255 of the second intermediate semiconductor chip 200B, the second upper bonding pad 255 of the second lower semiconductor chip 200A and the second bonding pad 250 of the second intermediate semiconductor chip 200B may be well bonded to each other in a direct bonding manner.

The thickness T21 of the second upper bonding pad 255 of the second lower semiconductor chip 200A may be smaller than the thickness T20 of the second bonding pad 250 of the second intermediate semiconductor chip 200B. A width of the second upper bonding pad 255 of the second lower semiconductor chip 200A may be larger than a width of the second bonding pad 250 of the second intermediate semiconductor chip 200B. For example, the width W21 of the top surface of the second upper bonding pad 255 of the second lower semiconductor chip 200A may be larger than the width W20 of the bottom surface of the second bonding pad 250 of the second intermediate semiconductor chip 200B. Even when there is a process error in a process of disposing the second intermediate semiconductor chip 200B, the second bonding pad 250 of the second intermediate semiconductor chip 200B may be in good contact with the second upper bonding pad 255 of the second lower semiconductor chip 200A. In an embodiment, the width W21 of the top surface of the second upper bonding pad 255 of the second lower semiconductor chip 200A may be larger than the width W20 of the bottom surface of the second bonding pad 250 of the second intermediate semiconductor chip 200B and may be smaller than or equal to 2 times the width W20.

The second back-side insulating layer 230 of the second lower semiconductor chip 200A and the second insulating layer 221 of the second intermediate semiconductor chip 200B may be connected to each other in a direct bonding manner. A chemical bond may be provided between the second back-side insulating layer 230 of the second lower semiconductor chip 200A and the second insulating layer 221 of the second intermediate semiconductor chip 200B. There may be no observable interface between the second back-side insulating layer 230 of the second lower semiconductor chip 200A and the second insulating layer 221 of the second intermediate semiconductor chip 200B.

Referring to FIG. 1A, the second interconnection patterns 225 may be horizontally spaced apart from each other. The second insulating layer 221 of the second intermediate semiconductor chip 200B may have a first bottom surface or a first bottom surface portion and a second bottom surface or a second bottom surface portion. The first bottom surface and the second bottom surfaces of the second insulating layer 221 of the second intermediate semiconductor chip 200B may be substantially the same as the first bottom surface $221u1$ and the second bottom surface $221u2$ of the second insulating layer 221 of the second lower semiconductor chip 200A previously described with reference to FIG. 1E. For example, the first bottom surface of the second insulating layer 221 of the second intermediate semiconductor chip 200B may be vertically overlapped or aligned with the second interconnection patterns 225 of the second intermediate semiconductor chip 200B and may be directly bonded to a top surface of the second back-side insulating layer 230 of the second lower semiconductor chip 200A with a good bonding profile. The second bottom surface of the second insulating layer 221 of the second intermediate semiconductor chip 200B may not be vertically overlapped or aligned with the second interconnection patterns 225 of the second intermediate semiconductor chip 200B. The second bottom surface of the second insulating layer 221 of the second intermediate semiconductor chip 200B may be spaced apart from the second back-side insulating layer 230 of the second lower semiconductor chip 200A. As another example, the second bottom surface of the second insulating layer 221 of the second intermediate semiconductor chip 200B may be in contact with the second back-side insulating layer 230 of the second lower semiconductor chip 200A but may not be chemically coupled to the second back-side insulating layer 230.

The second upper semiconductor chip 200C may be connected to the second intermediate semiconductor chip 200B in a direct bonding manner. The direct bonding structure between the second upper semiconductor chip 200C and the second intermediate semiconductor chip 200B may be substantially the same as the direct bonding structure between the second intermediate semiconductor chip 200B and the second lower semiconductor chip 200A described with reference to FIG. 1F. For example, the second upper bonding pad 255 of the second intermediate semiconductor chip 200B and the second bonding pad 250 of the second upper semiconductor chip 200C may be in direct contact with each other and may be connected to each other in a direct bonding manner. There may be no observable interface between the second upper bonding pad 255 of the second intermediate semiconductor chip 200B and the second bonding pad 250 of the second upper semiconductor chip 200C. The second back-side insulating layer 230 of the second intermediate semiconductor chip 200B and the second insulating layer 221 of the second upper semiconductor chip 200C may be connected to each other in a direct bonding manner. A chemical bond may be provided between the second back-side insulating layer 230 of the second intermediate semiconductor chip 200B and the second insulating layer 221 of the second upper semiconductor chip 200C. There may be no observable interface between the second back-side insulating layer 230 of the second intermediate semiconductor chip 200B and the second insulating layer 221 of the second upper semiconductor chip 200C.

Hereinafter, the third semiconductor chip 300 and a bonding structure between the second semiconductor chip 200 and the third semiconductor chip 300 will be described in more detail.

Figure 1G:
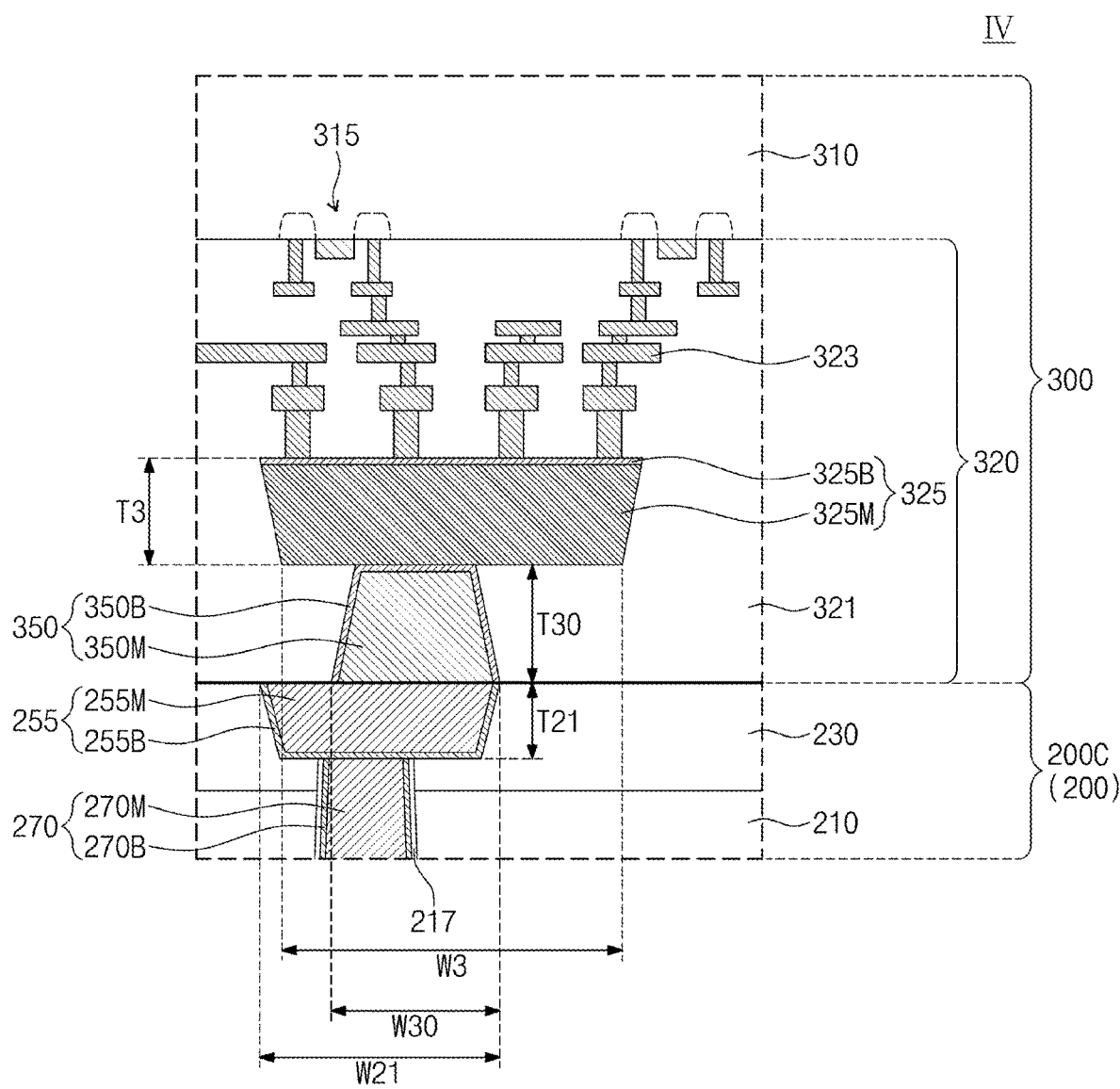
FIG. 1G is an enlarged sectional view illustrating a portion IV of FIG. 1A.

FIG. 1G is an enlarged sectional view illustrating a portion IV of FIG. 1A. The description that follows will refer to an example in which just one second semiconductor chip is provided, for convenience in description.

Referring to FIGS. 1A and 1G, the third semiconductor chip 300 may be provided on the second semiconductor chip 200. The third semiconductor chip 300 may include the third semiconductor substrate 310, the third interconnection layer 320, the third bonding pad 350, and third integrated circuits 315. A top surface of the third semiconductor substrate 310 may be a top surface of the third semiconductor chip 300. In an embodiment, the third semiconductor substrate 310 may be formed of or include at least one of silicon, germanium, or silicon germanium. The third integrated circuits 315 may be provided on a bottom surface of the third semiconductor substrate 310. The third integrated circuits 315 may include transistors. The third interconnection layer 320 may be provided on the bottom surface of the third semiconductor substrate 310. The third interconnection layer 320 may include an FEOL layer and a BEOL layer. The third interconnection layer 320 may include the third insulating layer 321, the third interconnection patterns 325, and third interconnection structures 323. The third insulating layer 321 may be provided on the bottom surface of the third semiconductor substrate 310 to cover the third integrated circuits 315. The third insulating layer 321 may include a plurality of layers. The third insulating layer 321 may include a silicon-containing insulating material. The third interconnection structures 323 may be provided in the third insulating layer 321. The third interconnection structures 323 may be electrically connected to the third integrated circuits 315. The third interconnection structures 323 may include third interconnection lines and third vias, which are connected to the third interconnection lines. The third interconnection lines and the third vias may be formed of or include at least one metallic material.

The third interconnection patterns 325 may correspond to the lowermost interconnection lines of the third insulating layer 321. As an example, the third interconnection patterns 325 may correspond to the lowermost interconnection lines of the BEOL layer. Each of the third interconnection patterns 325 may have an inclined side surface. For example, an angle between bottom and side surfaces of each of the third interconnection patterns 325 may be an obtuse angle. An angle between side surface and top surface of each of the third interconnection patterns 325 may be an acute angle. The bottom surface of each of the third interconnection patterns 325 may have a third width W3. A width of the top surface of each of the third interconnection patterns 325 may be larger than the third width W3. As an example, a width of the third interconnection patterns 325 may increase in a direction from its bottom surface toward its top surface. A third thickness T3 of the third interconnection pattern 325 may be larger than thicknesses of the third interconnection lines of the third interconnection structures 323. For example, the third thickness T3 may range from 1 μm to 5 μm.

Each of the third interconnection patterns 325 may include a third barrier layer 325B and a third metal line 325M. The third barrier layer 325B may be provided on a top surface of the third metal line 325M. The third barrier layer 325B may be formed of or include at least one of titanium, tantalum, and/or alloys thereof. A thickness of the third barrier layer 325B may be smaller than a thickness of the third metal line 325M. The third metal line 325M may be formed of or include at least one of aluminum, tin, and/or zinc.

The third bonding pads 350 may be provided on a bottom surface of the third interconnection layer 320. For example, the third bonding pads 350 may be provided in the third interconnection layer 320, and in this case, the third insulating layer 321 may be provided to expose bottom surfaces of the third bonding pads 350. A bottom surface of the third semiconductor chip 300 may include the bottom surface of the third interconnection layer 320 and the bottom surfaces of the third bonding pads 350. Top surfaces of the third bonding pads 350 may be in direct contact with the third interconnection patterns 325. The third bonding pads 350 may be electrically connected to the third integrated circuits 315 through the third interconnection structures 323. An angle between bottom and side surfaces of the third bonding pads 350 may be an acute angle. An angle between side and top surfaces of the first bonding pads 155 may be an obtuse angle. A width W30 of the bottom surface of each of the third bonding pads 350 may be larger than a width of a top surface thereof. The width W30 of the bottom surface of each of the third bonding pads 350 may range from 1 μm to 6 μm.

Each of the third bonding pads 350 may include a third metal pad or a third metal pad portion 350M and a third barrier pad or a third barrier pad portion 350B. The third barrier pad 350B may be provided on top and side surfaces of the third metal pad 350M. The third barrier pad 350B may be formed of or include at least one of titanium, tantalum, and/or alloys thereof. The third metal pad 350M may be formed of or include a metallic material different from the third metal line 325M. For example, the third metal pad 350M may be formed of or include copper.

The third interconnection patterns 325 may have a thermal expansion coefficient that is greater than that of the third bonding pads 350. The third metal line 325M may have a thermal expansion coefficient that is greater than that of the third metal pad 350M. For example, the thermal expansion coefficient of the third metal line 325M may be greater than 18 ppm/K and may be smaller than or equal to 50 ppm/K. The thermal expansion coefficient of the third metal pad 350M may range from 5 ppm/K to 18 ppm/K. The description that follows will refer to an example in which a single second upper bonding pad 255, a single third bonding pad 350, and a single third interconnection pattern 325 are provided, for convenience in description.

The third semiconductor chip 300 may be connected to the second upper semiconductor chip 200C in a direct bonding manner. For example, the second upper bonding pad 255 of the second upper semiconductor chip 200C and the third bonding pad 350 of the third semiconductor chip 300 may be connected to each other in a direct bonding manner. There may be no observable interface between the second upper bonding pad 255 of the second upper semiconductor chip 200C and the third bonding pad 350 of the third semiconductor chip 300.

The third thickness T3 may be 0.5 to 1.5 times a thickness T30 of the third bonding pad 350. According to an embodiment of the inventive concept, since the third thickness T3 is larger than 0.5 times the thickness T30 of the third bonding pad 350 of the third semiconductor chip 300, the third interconnection pattern 325 may exert a sufficiently strong force on the third bonding pad 350 and the second bonding pad 250 of the second upper semiconductor chip 200C during the direct bonding process. Since the third thickness T3 is smaller than 1.5 times the thickness of the third bonding pad 350 of the third semiconductor chip 300, the third insulating layer 321 may not be delaminated from the third interconnection pattern 325.

The third width W3 may be larger than the width W30 of the bottom surface of the third bonding pad 350. Accordingly, the bottom surface of the third bonding pad 350 may be vertically overlapped or aligned with a corresponding one of the third interconnection patterns 325.

A width of the second upper bonding pad 255 of the second upper semiconductor chip 200C may be equal to or larger than a width of the third bonding pad 350. For example, the width W21 of the top surface of the second upper bonding pad 255 of the second upper semiconductor chip 200C may be larger than the width W30 of the bottom surface of the third bonding pad 350. Accordingly, in a process of disposing the third semiconductor chip 300, the third bonding pad 350 may be well coupled to the second upper bonding pad 255 of the second upper semiconductor chip 200C.

The width W21 of the top surface of the second upper bonding pad 255 of the second upper semiconductor chip 200C may be larger than the width W30 of the bottom surface of the third bonding pad 350 and may be smaller than or equal to two times the width W30.

The thickness T21 of the second upper bonding pad 255 of the second upper semiconductor chip 200C may be smaller than the thickness T30 of the third bonding pad 350.

The second back-side insulating layer 230 of the second upper semiconductor chip 200C and the third insulating layer 321 of the third semiconductor chip 300 may be connected to each other in a direct bonding manner. A chemical bond may be provided between the second back-side insulating layer 230 of the second upper semiconductor chip 200C and the third insulating layer 321 of the third semiconductor chip 300.

As shown in FIG. 1A, a plurality of the third interconnection patterns 325 may be horizontally spaced apart from each other. The third insulating layer 321 may have a first bottom surface (portion) and a second bottom surface (portion). The first bottom surface and the second bottom surface of the third insulating layer 321 may be similar to the first bottom surface 221u1 and the second bottom surface 221u2 of the second insulating layer 221 described with reference to FIG. 1E. For example, the first bottom surface of the third insulating layer 321 may be vertically overlapped or aligned with the third interconnection patterns 325 and may be well bonded to the second back-side insulating layer 230 of the second upper semiconductor chip 200C in a direct bonding manner. The second bottom surface of the third insulating layer 321 may not be vertically overlapped or aligned with the third interconnection patterns 325. A portion of the bottom surface of the third semiconductor chip 300 may be vertically spaced apart from the second back-side insulating layer 230 of the second upper semiconductor chip 200C. As another example, the bottom surface the third semiconductor chip 300 may be in contact with the second back-side insulating layer 230 of the second upper semiconductor chip 200C but may not be chemically bonded to the second back-side insulating layer 230.

Figure 2A:
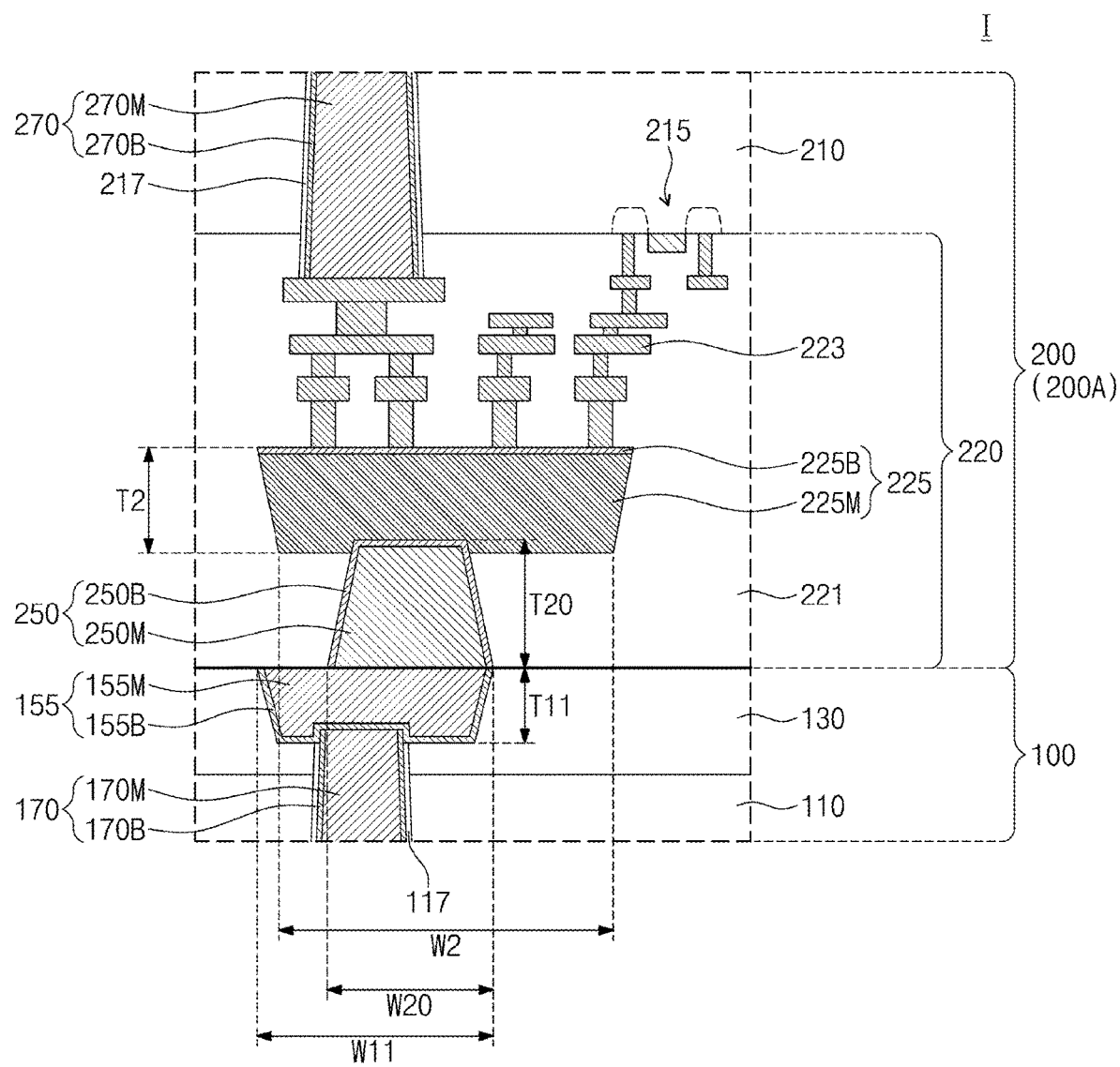
FIG. 2A is a diagram illustrating a direct bonding structure between a first semiconductor chip and a second semiconductor chip, according to an embodiment of the inventive concept.
Figure 2B:
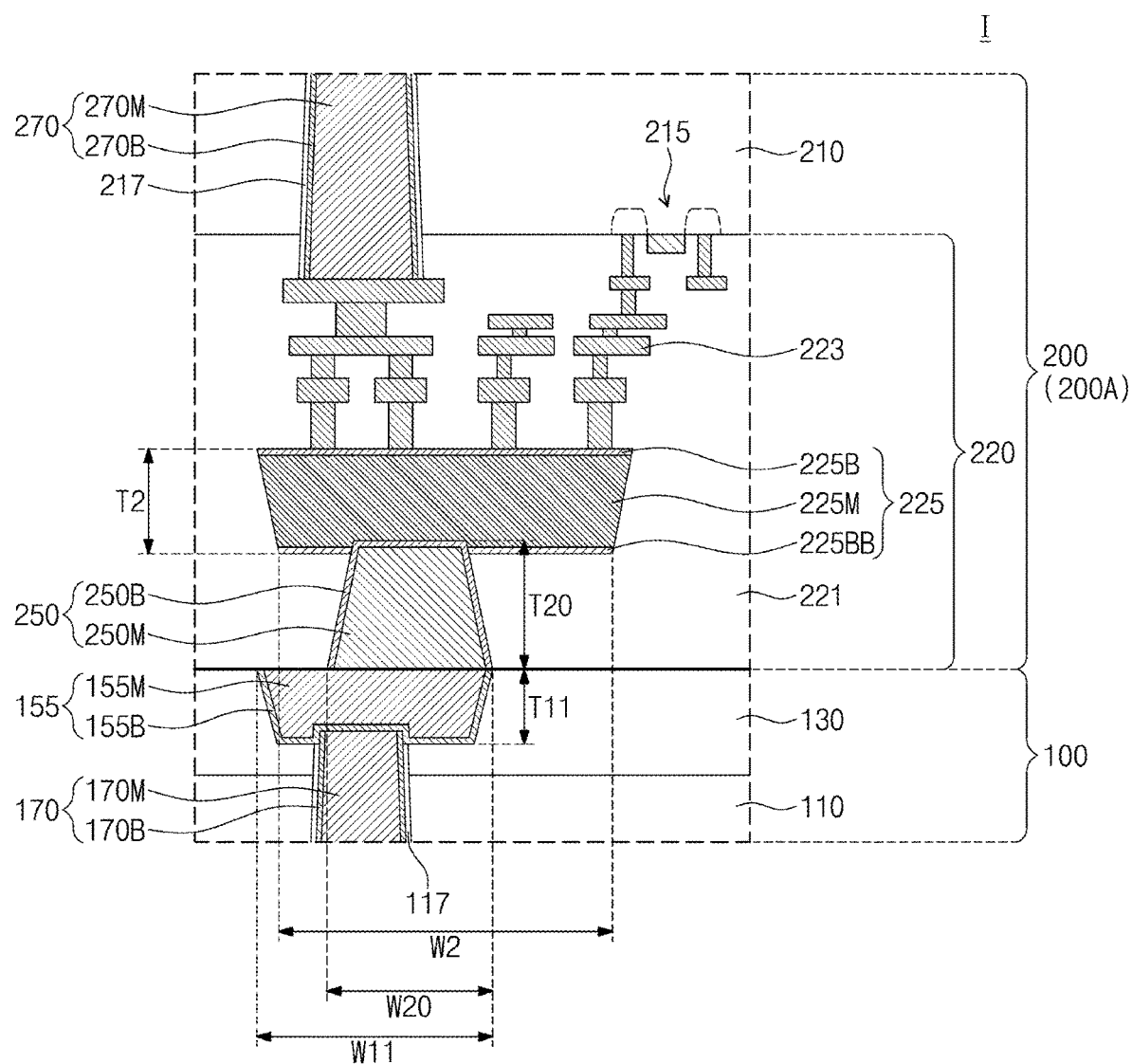
FIG. 2B is a diagram illustrating a direct bonding structure between a first semiconductor chip and a second semiconductor chip, according to an embodiment of the inventive concept.

FIG. 2A is a diagram illustrating a direct bonding structure between a first semiconductor chip and a second semiconductor chip, according to an embodiment of the inventive concept, and is an enlarged sectional view illustrating a portion I of FIG. 1A. FIG. 2B is a diagram illustrating a direct bonding structure between a first semiconductor chip and a second semiconductor chip, according to an embodiment of the inventive concept, and is an enlarged sectional view illustrating the portion I of FIG. 1A. In the following description of FIGS. 2A and 2B, one first penetration via will be described in more detail with further reference to FIG. 1A.

Referring to FIGS. 2A and 2B, the second semiconductor chip 200 may be connected to the first semiconductor chip 100 in a direct bonding manner. For example, the second bonding pad 250 of the second lower semiconductor chip 200A may be directly bonded to the first bonding pad 155 of the first semiconductor chip 100. However, the second bonding pad 250 may be provided with a protruding portion that is partially inserted into the second interconnection pattern 225. For example, a top surface of the second bonding pad 250 may be provided at a level higher than a bottom surface of the second interconnection pattern 225. Here, the bottom surface of the second interconnection pattern 225 may be a surface that is covered with the second insulating layer 221.

The first penetration via 170 may include a protruding portion that is partially inserted into the first bonding pad 155. For example, a top surface of the first penetration via 170 may be provided at a level higher than a bottom surface of the first bonding pad 155. The bottom surface of the first bonding pad 155 may be provided on the first back-side insulating layer 130.

Referring to FIG. 2B, the second interconnection pattern 225 may further include a second lower barrier layer 225BB, in addition to the second metal line 225M and the second barrier layer 225B. The second lower barrier layer 225BB may be provided on a bottom surface of the second metal line 225M. A thickness of the second lower barrier layer 225BB may be smaller than a thickness of the second metal line 225M. The second lower barrier layer 225BB may be formed of or include at least one of titanium, tantalum, and/or alloys thereof.

Figure 2C:
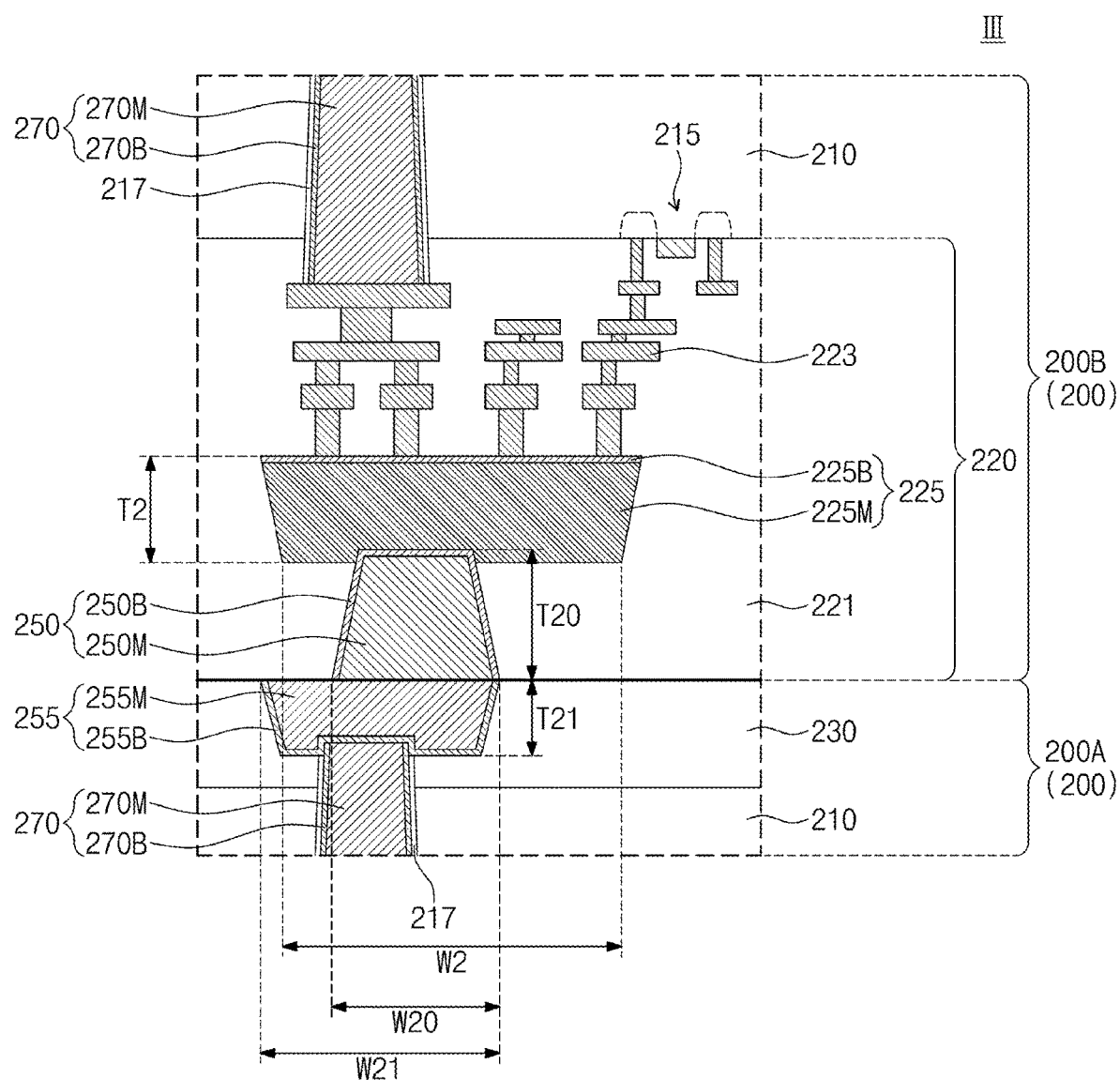
FIG. 2C is a diagram illustrating a direct bonding structure between second semiconductor chips, according to an embodiment of the inventive concept.

FIG. 2C is a diagram illustrating a direct bonding structure between second semiconductor chips, according to an embodiment of the inventive concept, and is an enlarged sectional view illustrating a portion III of FIG. 1A. In the following description of FIG. 2C, one second penetration via will be described in more detail with further reference to FIG. 1A.

Referring to FIG. 2C, the second bonding pad 250 of the second intermediate semiconductor chip 200B may be directly bonded to the second upper bonding pad 255 of the second lower semiconductor chip 200A. However, the second bonding pad 250 of the second intermediate semiconductor chip 200B may include a protruding portion that is partially inserted into the second interconnection pattern 225 of the second intermediate semiconductor chip 200B. For example, the top surface of the second bonding pad 250 may be located at a level higher than the bottom surface of the second interconnection pattern 225.

The second penetration via 270 of the second lower semiconductor chip 200A may include a protruding portion that is partially inserted into the second upper bonding pad 255 of the second lower semiconductor chip 200A. For example, a top surface of the second penetration via 270 may be located at a level higher than a bottom surface of the second upper bonding pad 255.

Although not shown, the second interconnection pattern 225 of the second intermediate semiconductor chip 200B may further include the second lower barrier layer 225BB of FIG. 2B, in addition to the second metal line 225M and the second barrier layer 225B.

Figure 2D:
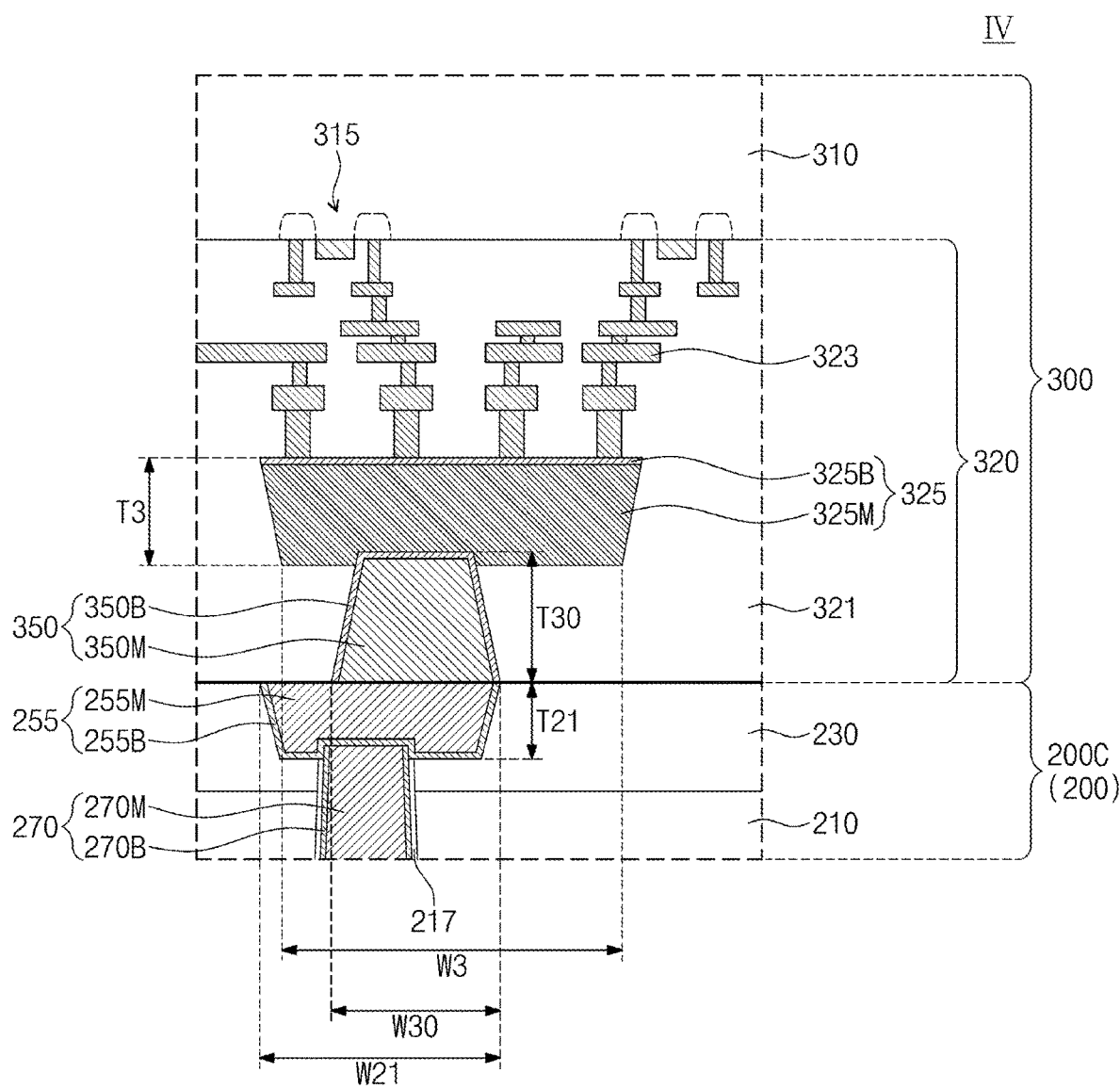
FIG. 2D is a diagram illustrating a direct bonding structure between a second semiconductor chip and a third semiconductor chip, according to an embodiment of the inventive concept.

FIG. 2D is a diagram illustrating a direct bonding structure between a second semiconductor chip and a third semiconductor chip, according to an embodiment of the inventive concept, and is an enlarged sectional view illustrating a portion IV of FIG. 1A.

Referring to FIG. 2D, the third bonding pad 350 of the third semiconductor chip 300 may be directly bonded to the second upper bonding pad 255 of the second upper semiconductor chip 200C. The third bonding pad 350 of the third semiconductor chip 300 may include a protruding portion that is partially inserted into the third interconnection pattern 325. For example, a top surface of the third bonding pad 350 may be provided at a level higher than a bottom surface of the third interconnection pattern 325. Here, the bottom surface of the third interconnection pattern 325 may be a surface covered with the third insulating layer 321.

The second penetration via 270 of the second upper semiconductor chip 200C may include a protruding portion that is partially inserted into the second upper bonding pad 255 of the second upper semiconductor chip 200C. For example, a top surface of the second penetration via 270 may be provided at a level higher than the bottom surface of the second upper bonding pad 255.

Although not shown, the third interconnection pattern 325 may further include a third lower barrier layer, in addition to the third metal line 325M and the third barrier layer 325B. The third lower barrier layer may be provided on the bottom surface of the third interconnection pattern 325. The third lower barrier layer may be substantially the same as the second lower barrier layer 225BB of FIG. 2B.

Figure 3A:
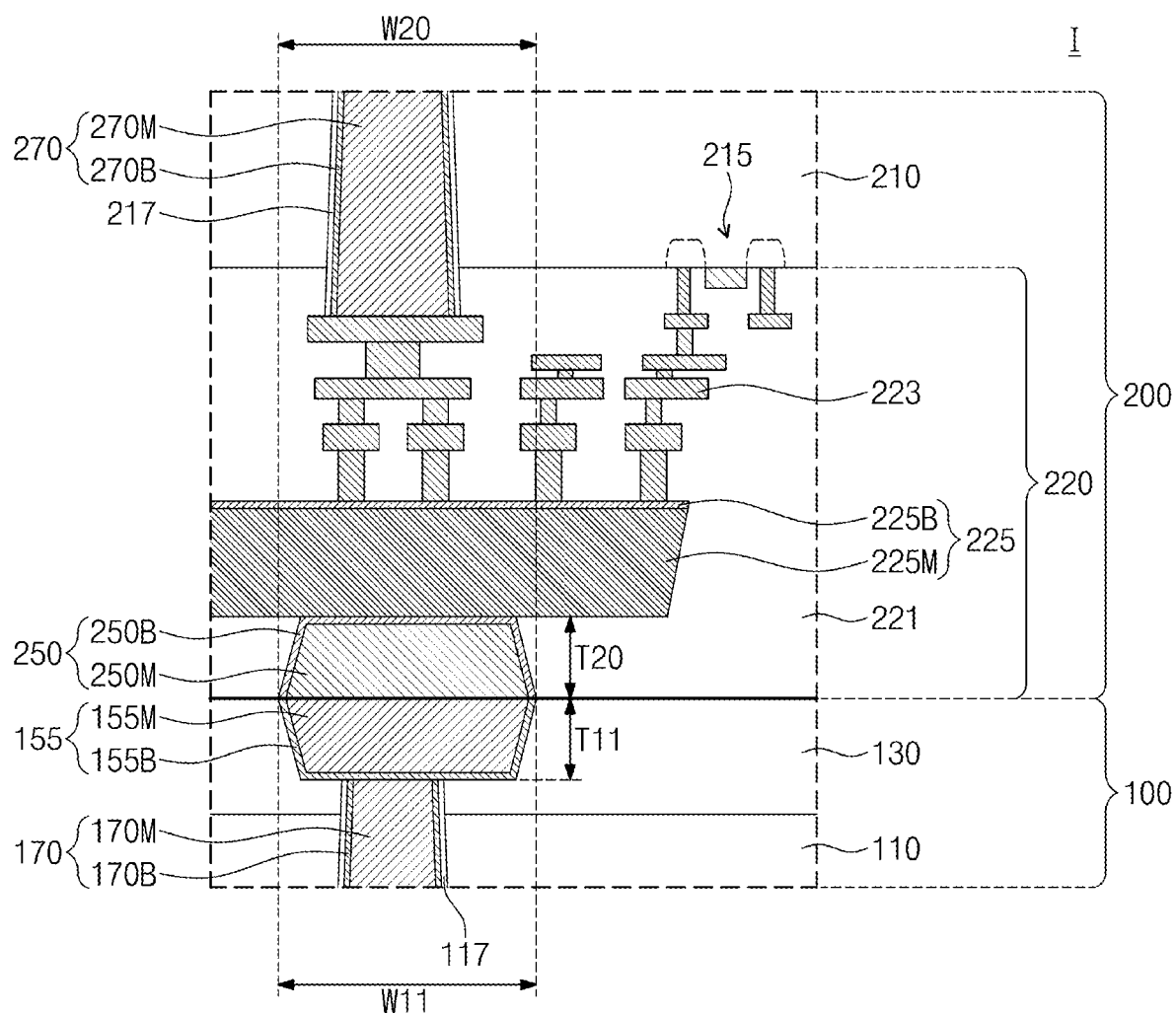
FIG. 3A is a diagram illustrating a direct bonding structure between a first semiconductor chip and a second semiconductor chip, according to an embodiment of the inventive concept.

FIG. 3A is a diagram illustrating a direct bonding structure between a first semiconductor chip and a second semiconductor chip, according to an embodiment of the inventive concept, and is an enlarged sectional view illustrating the portion I of FIG. 1A. Hereinafter, the present embodiment will be described with reference to FIG. 3A, in conjunction with FIG. 1A.

Referring to FIG. 3A, the second semiconductor chip 200 may be connected to the first semiconductor chip 100 in a direct bonding manner. For example, the second lower semiconductor chip 200A may be directly bonded to the first semiconductor chip 100. The direct bonding structure between the second lower semiconductor chip 200A and the first semiconductor chip 100 may be substantially the same as that in the embodiment of FIGS. 1D and 1E. For example, the second bonding pad 250 of the second lower semiconductor chip 200A may be directly bonded to the first bonding pad 155 of the first semiconductor chip 100. However, the width W20 of the bottom surface of the second bonding pad 250 may be substantially the same as the width W11 of the top surface of the first bonding pad 155. The thickness T20 of the second bonding pad 250 may be equal to or different from the thickness T11 of the first bonding pad 155.

Figure 3B:
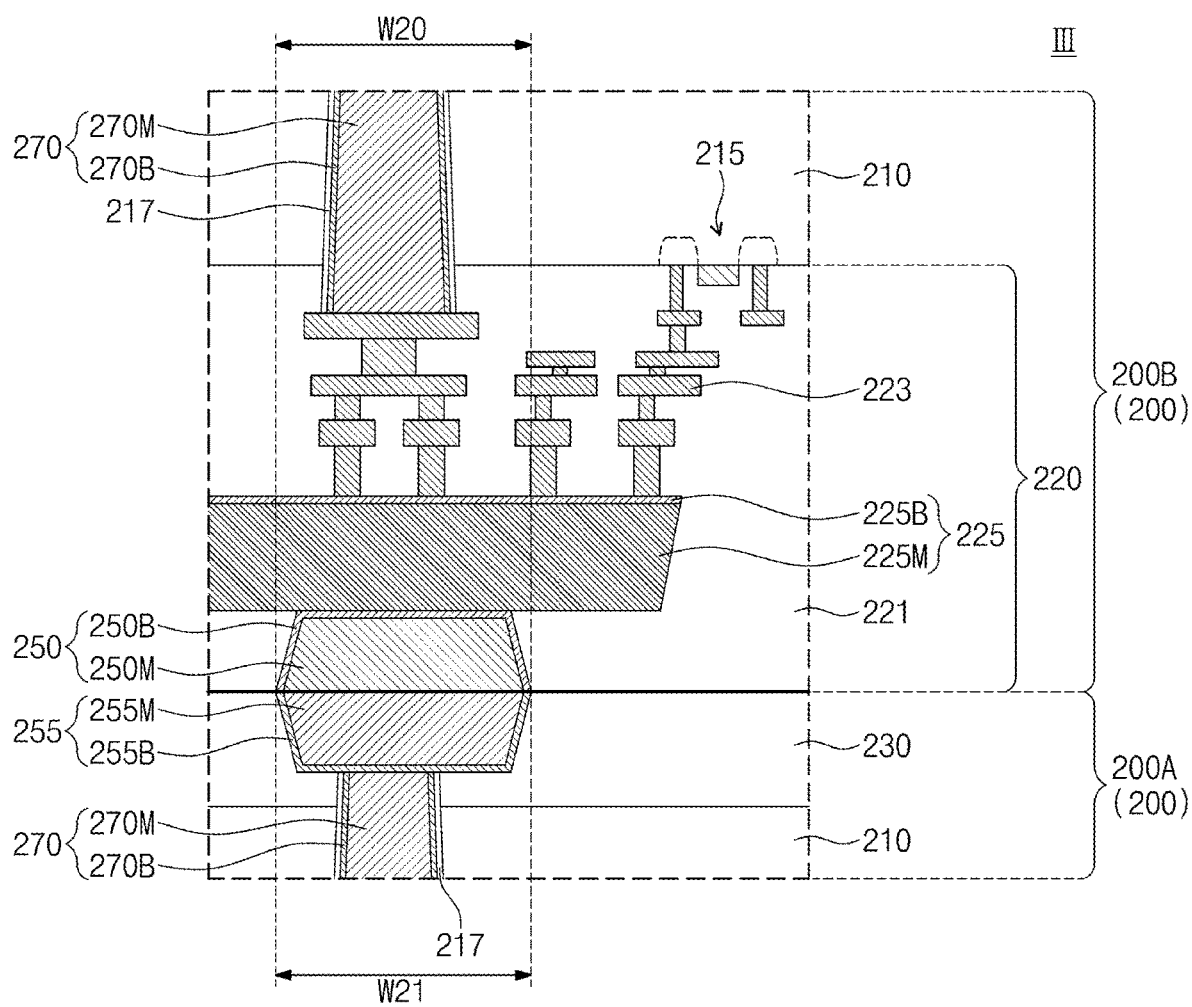
FIG. 3B is a diagram illustrating a direct bonding structure between second semiconductor chips, according to an embodiment of the inventive concept.

FIG. 3B is a diagram illustrating a direct bonding structure between second semiconductor chips, according to an embodiment of the inventive concept, and is an enlarged sectional view illustrating the portion III of FIG. 1A. Hereinafter, the present embodiment will be described with reference to FIG. 3B, in conjunction with FIG. 1A.

Referring to FIG. 3B, the second intermediate semiconductor chip 200B may be connected to the second lower semiconductor chip 200A in a direct bonding manner. The direct bonding structure between the second lower semiconductor chip 200A and the second intermediate semiconductor chip 200B may be the same as or similar to that in the previous embodiment of FIG. 1F. For example, the second bonding pad 250 of the second intermediate semiconductor chip 200B may be directly bonded to the second upper bonding pad 255 of the second lower semiconductor chip 200A. However, the width W20 of the bottom surface of the second bonding pad 250 of the second intermediate semiconductor chip 200B may be substantially the same as the width W21 of the top surface of the second upper bonding pad 255 of the second lower semiconductor chip 200A.

Referring back to FIG. 1A, the direct bonding structure between the second upper semiconductor chip 200C and the second intermediate semiconductor chip 200B may be similar to the direct bonding structure between the second intermediate semiconductor chip 200B and the second lower semiconductor chip 200A described with reference to the embodiment of FIG. 3B. For example, unlike the structure shown in FIG. 3A, the bottom surface of the second bonding pad 250 of the second upper semiconductor chip 200C may have a width that is substantially the same as the width of the top surface of the second upper bonding pad 255 of the second intermediate semiconductor chip 200B.

Figure 3C:
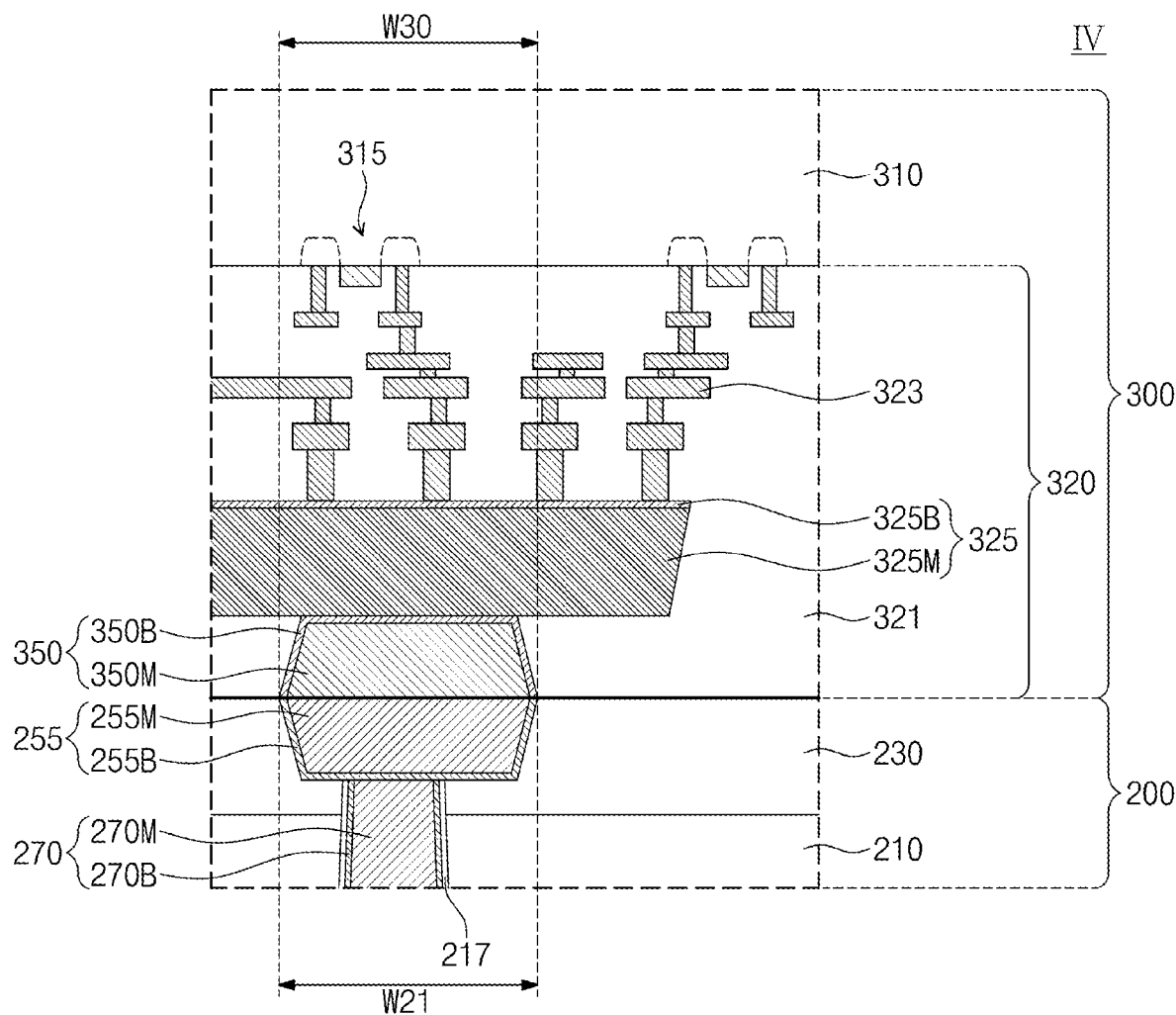
FIG. 3C is a diagram illustrating a direct bonding structure between a second semiconductor chip and a third semiconductor chip, according to an embodiment of the inventive concept.

FIG. 3C is a diagram illustrating a direct bonding structure between a second semiconductor chip and a third semiconductor chip, according to an embodiment of the inventive concept, and is an enlarged sectional view illustrating the portion IV of FIG. 1A. Hereinafter, the present embodiment will be described with reference to FIG. 3C, in conjunction with FIG. 1A.

Referring to FIG. 3C, the third semiconductor chip 300 may be connected to the second upper semiconductor chip 200C in a direct bonding manner. The direct bonding structure between the second upper semiconductor chip 200C and the third semiconductor chip 300 may be the same as or similar to that in the previous embodiment of FIG. 1G. For example, the third bonding pad 350 of the third semiconductor chip 300 may be directly bonded to the second upper bonding pad 255 of the second upper semiconductor chip 200C. However, the width W30 of the bottom surface of the third bonding pad 350 of the third semiconductor chip 300 may be substantially the same as the width W21 of the top surface of the second upper bonding pad 255 of the second upper semiconductor chip 200C.

Figure 4A:
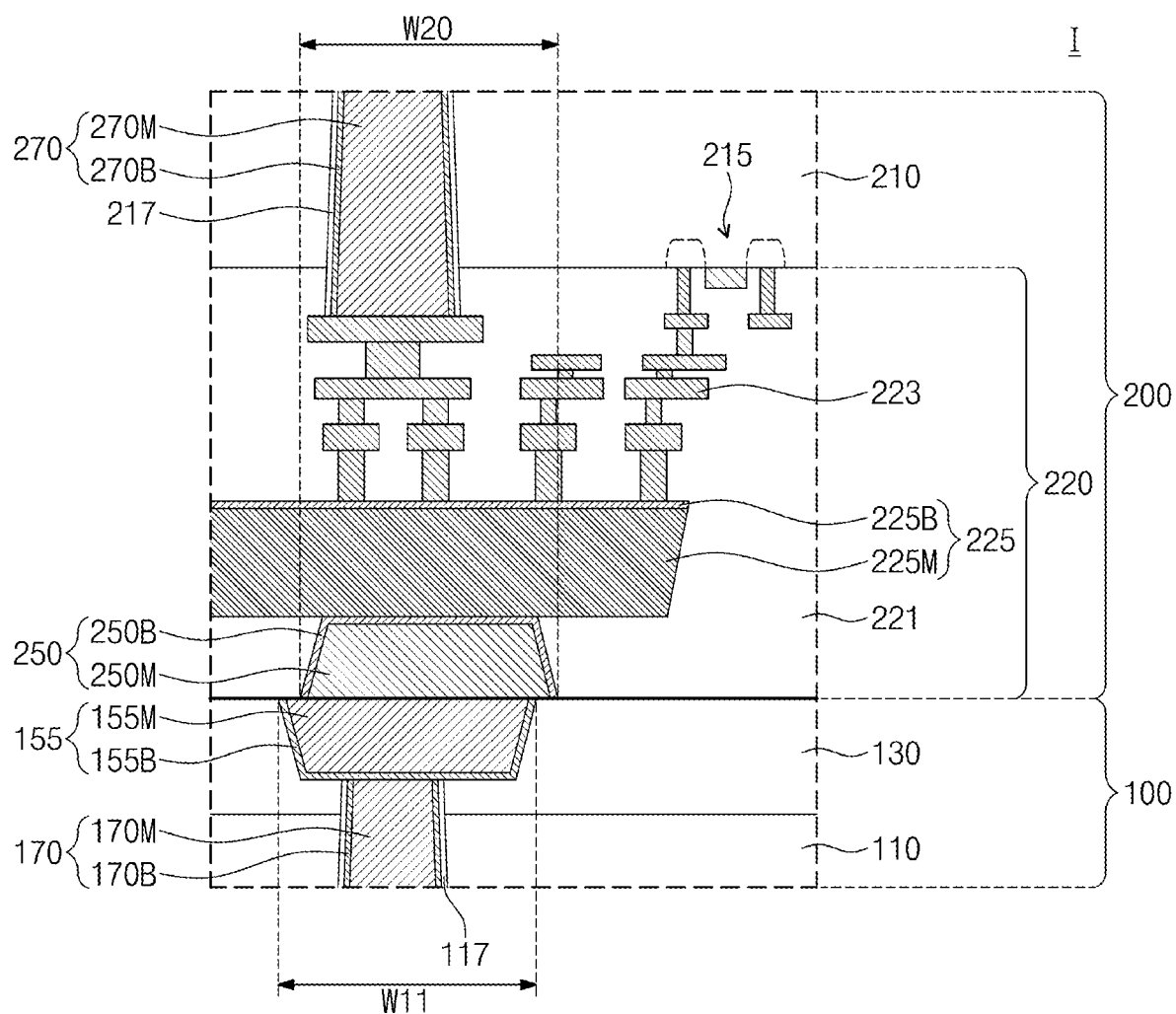
FIG. 4A is a diagram illustrating a direct bonding structure between a first semiconductor chip and a second semiconductor chip, according to an embodiment of the inventive concept.

FIG. 4A is a diagram illustrating a direct bonding structure between a first semiconductor chip and a second semiconductor chip, according to an embodiment of the inventive concept, and is an enlarged sectional view illustrating the portion I of FIG. 1A. Hereinafter, the present embodiment will be described with reference to FIG. 4A, in conjunction with FIG. 1A.

Referring to FIG. 4A, the second semiconductor chip 200 may be connected to the first semiconductor chip 100 in a direct bonding manner. For example, the second lower semiconductor chip 200A may be directly bonded to the first semiconductor chip 100. The direct bonding structure between the second lower semiconductor chip 200A and the first semiconductor chip 100 may be substantially the same as that in the embodiment described with reference to FIG. 3A. For example, the bottom surface of the second bonding pad 250 of the second lower semiconductor chip 200A may be directly bonded to the top surface of the first bonding pad 155 of the first semiconductor chip 100. The width W20 of the bottom surface of the second bonding pad 250 may be substantially the same as the width W11 of the top surface of the first bonding pad 155. However, a center axis of the second bonding pad 250 may not be vertically aligned to a center axis of the first bonding pad 155 (e.g., the second bonding pad 250 and the first bonding pad 155 may be horizontally offset). In this case, a portion of the bottom surface of the second bonding pad 250 may be in contact with the first back-side insulating layer 130. Also, a portion of the top surface of the first bonding pad 155 may be in contact with the second insulating layer 221.

Figure 4B:
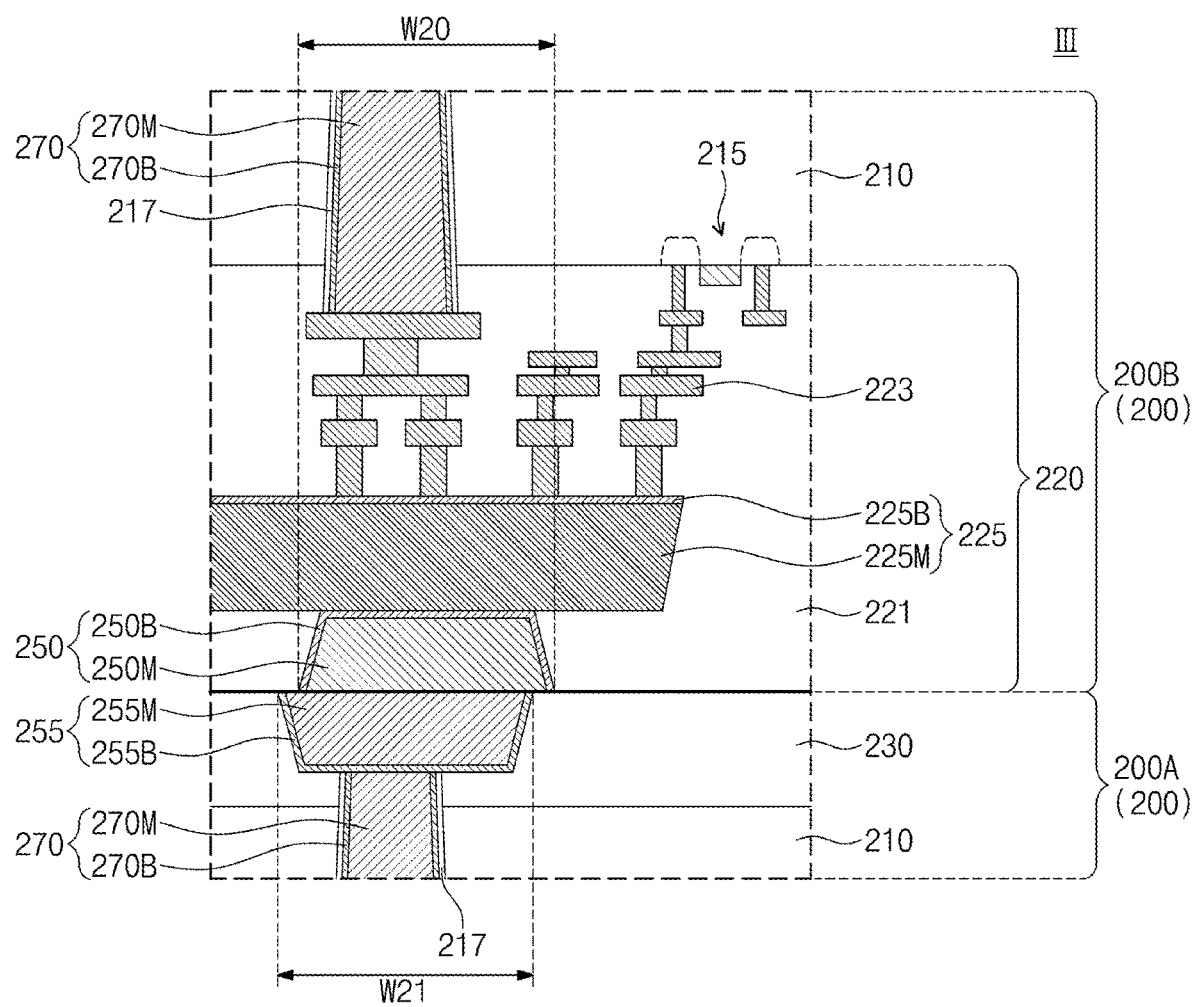
FIG. 4B is a diagram illustrating a direct bonding structure between second semiconductor chips, according to an embodiment of the inventive concept.

FIG. 4B is a diagram illustrating a direct bonding structure between second semiconductor chips, according to an embodiment of the inventive concept, and is an enlarged sectional view illustrating the portion III of FIG. 1A. Hereinafter, the present embodiment will be described with reference to FIG. 4B, in conjunction with FIG. 1A.

Referring to FIG. 4B, the second intermediate semiconductor chip 200B may be connected to the second lower semiconductor chip 200A in a direct bonding manner. The direct bonding structure between the second lower semiconductor chip 200A and the second intermediate semiconductor chip 200B may be the same as or similar to that in the previous embodiment of FIG. 3B. For example, the second bonding pad 250 of the second intermediate semiconductor chip 200B may be directly bonded to the second upper bonding pad 255 of the second lower semiconductor chip 200A. The width W20 of the bottom surface of the second bonding pad 250 of the second intermediate semiconductor chip 200B may be substantially the same as the width W21 of the top surface of the second upper bonding pad 255 of the second lower semiconductor chip 200A. However, a center axis of the second bonding pad 250 of the second intermediate semiconductor chip 200B may not be vertically aligned to a center axis of the second upper bonding pad 255 of the second lower semiconductor chip 200A (e.g., the second bonding pad 250 and the second upper bonding pad 255 may be horizontally offset). In this case, a portion of the bottom surface of the second bonding pad 250 of the second intermediate semiconductor chip 200B may be in contract with the second back-side insulating layer 230 of the second lower semiconductor chip 200A. Also, a portion of the top surface of the second upper bonding pad 255 of the second lower semiconductor chip 200A may be in contact with the second insulating layer 221.

The direct bonding structure between the second intermediate semiconductor chip 200B and the second upper semiconductor chip 200C shown in FIG. 1A may be modified in the same manner as the direct bonding structure between the second lower semiconductor chip 200A and the second intermediate semiconductor chip 200B described with reference to FIG. 4B.

The direct bonding structure between the second upper semiconductor chip 200C and the third semiconductor chip 300 shown in FIG. 1A may be modified in the same manner as the direct bonding structure between the second lower semiconductor chip 200A and the second intermediate semiconductor chip 200B described with reference to FIG. 4B.

Figure 5A:
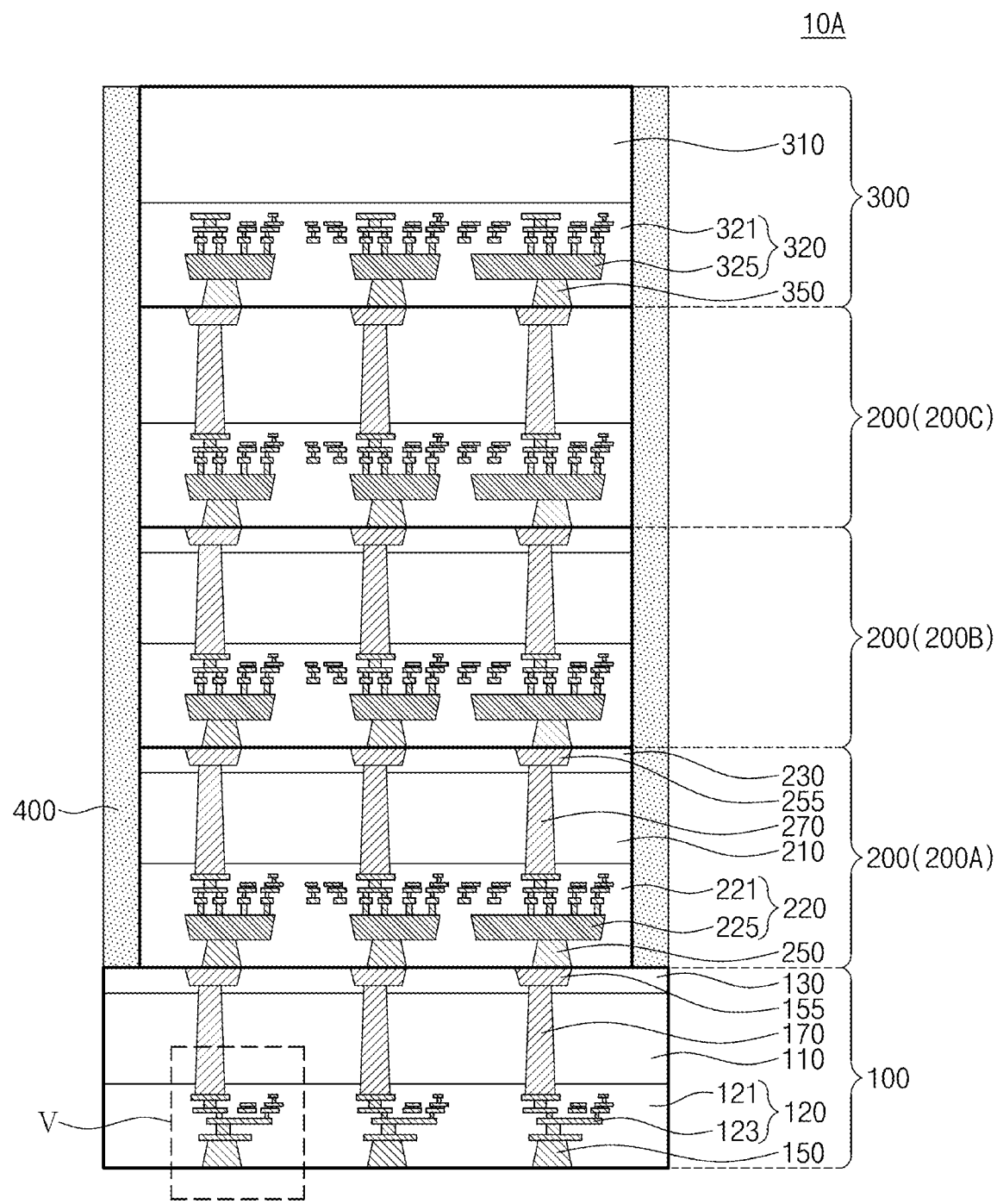
FIG. 5A is a diagram illustrating a semiconductor package according to an embodiment of the inventive concept.
Figure 5B:
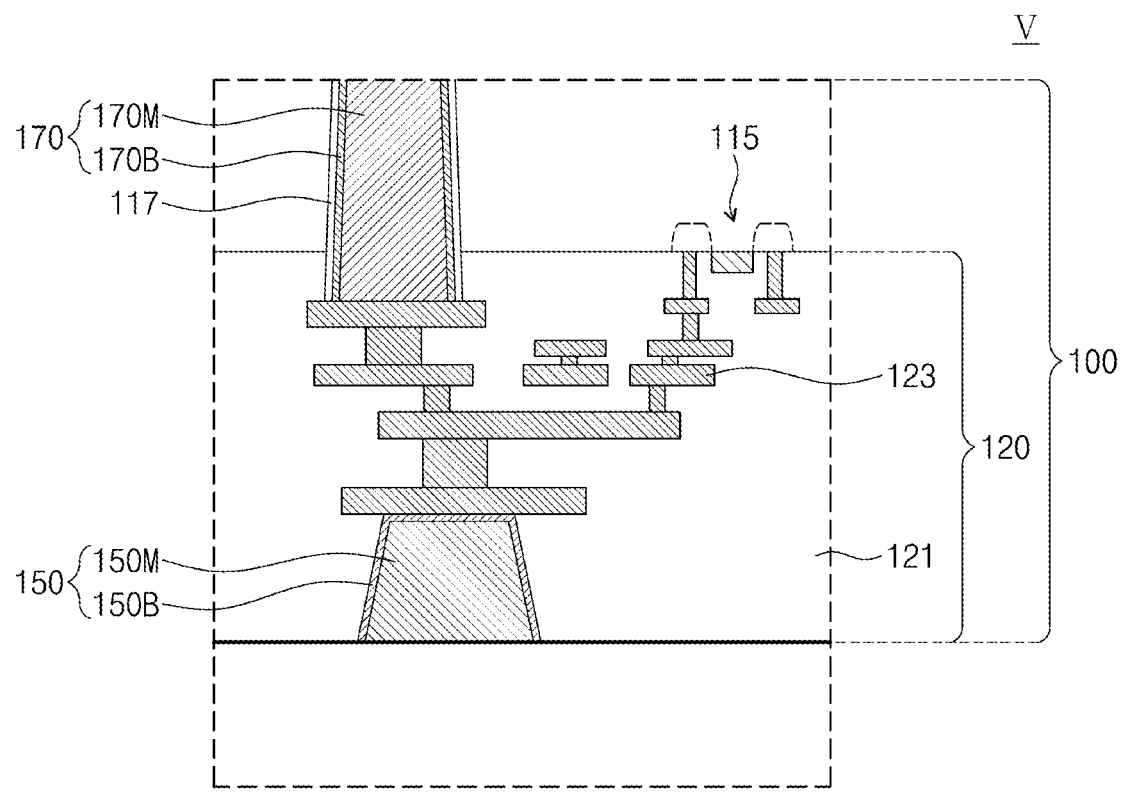
FIG. 5B is an enlarged sectional view illustrating a portion V of FIG. 5A.

FIG. 5A is a diagram illustrating a semiconductor package according to an embodiment of the inventive concept. FIG. 5B is an enlarged sectional view illustrating a portion V of FIG. 5A.

Referring to FIGS. 5A and 5B, the semiconductor package may be the chip stack 10A. The chip stack 10A may include the first semiconductor chip 100, the second semiconductor chip 200, the third semiconductor chip 300, and the first mold layer 400. The first semiconductor chip 100, the second semiconductor chip 200, the third semiconductor chip 300, and the first mold layer 400 may be substantially the same as the embodiments previously described with reference to FIGS. 1A to 1G. For example, the first semiconductor chip 100 may include the first semiconductor substrate 110, the first interconnection layer 120, the first conductive pads 150, the first integrated circuits 115, the first penetration vias 170, the first back-side insulating layer 130, and the first bonding pads 155. The first interconnection layer 120 may include the first insulating layer 121 and the first interconnection structures 123.

However, the first interconnection layer 120 may not include the first interconnection patterns 125 described with reference to the embodiment of FIGS. 1A and 1B. The first conductive pads 150 may be directly coupled to the first interconnection structures 123.

Figure 6A:
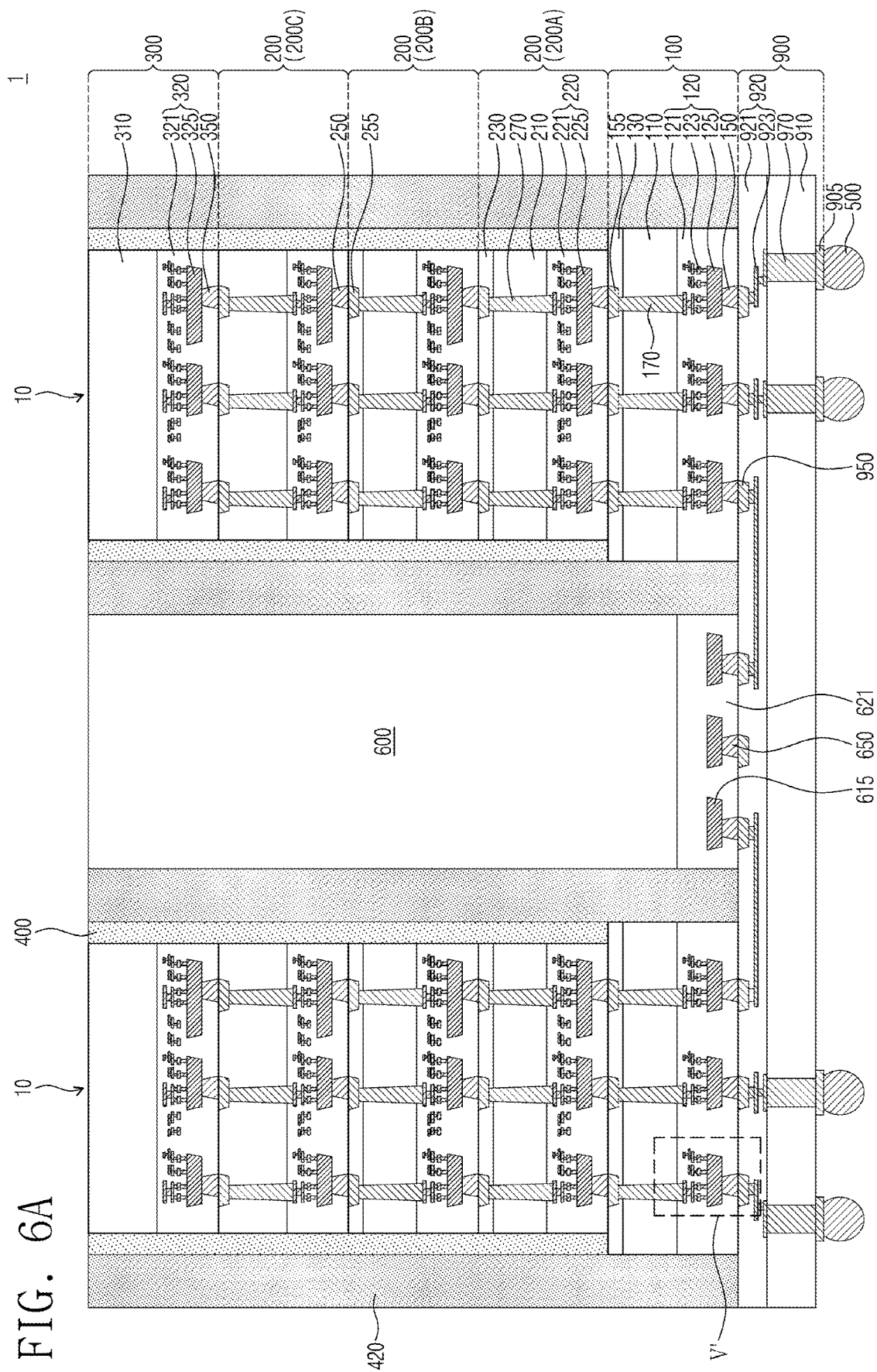
FIG. 6A is a diagram illustrating a semiconductor package according to an embodiment of the inventive concept.
Figure 6B:
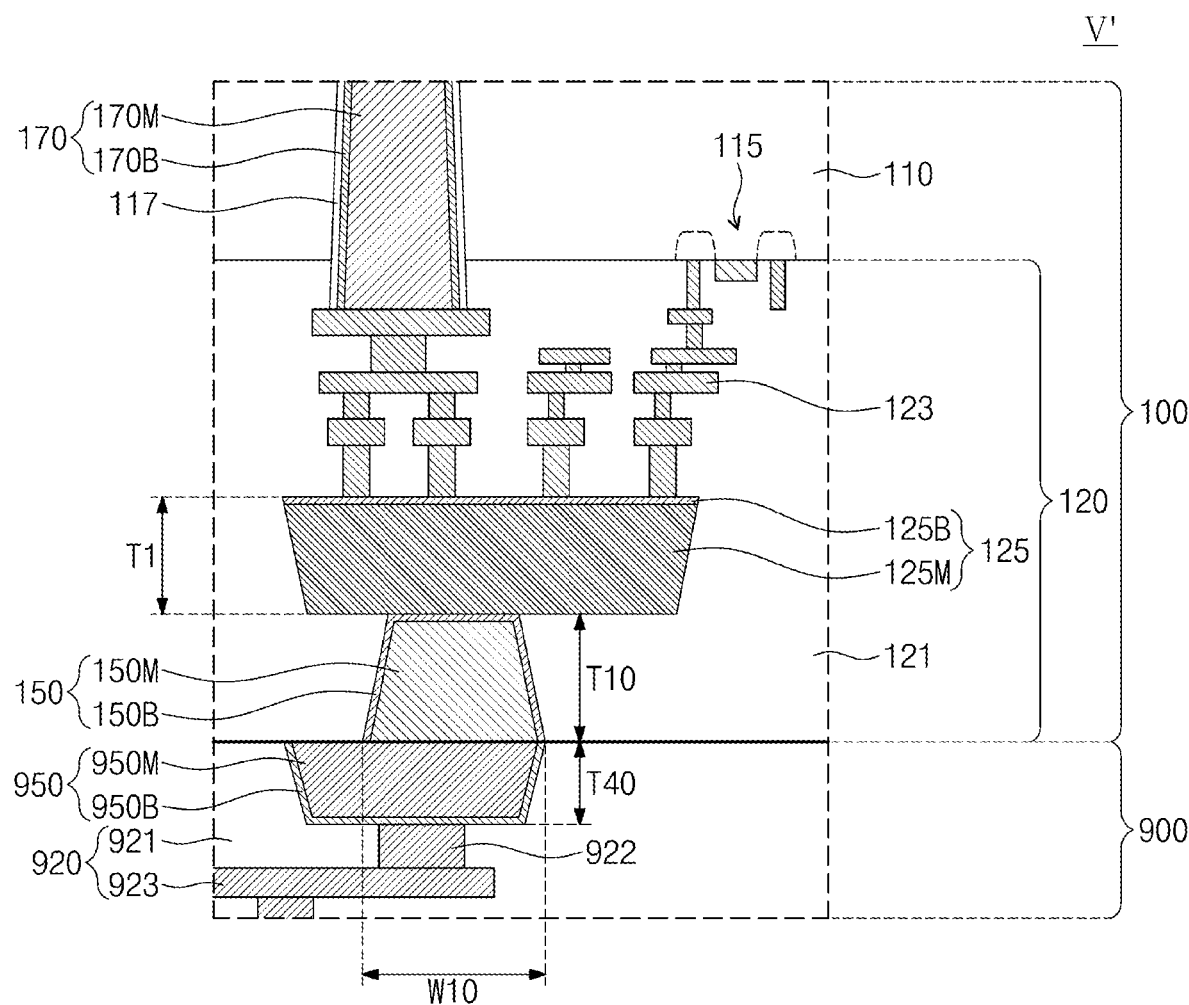
FIG. 6B is an enlarged sectional view illustrating a portion V of FIG. 6A.

FIG. 6A is a diagram illustrating a semiconductor package according to an embodiment of the inventive concept. FIG. 6B is an enlarged sectional view illustrating a portion V of FIG. 6A.

Referring to FIGS. 6A and 6B, a semiconductor package 1 may include a substrate, solder balls 500, a chip stack 10, and a fourth semiconductor chip 600. The substrate may be an interposer substrate 900. The interposer substrate 900 may include an interposer die 910, metal vias 970, an interposer interconnection layer 920, and bonding pads. The bonding pads may be interposer bonding pads 950. The interposer substrate 900 may not include an integrated circuit, such as transistors. For example, an integrated circuit may not be provided on the interposer die 910. The interposer die 910 may be the first substrate. The interposer die 910 may include a semiconductor die (e.g., a silicon die, a germanium die, or a silicon germanium die).

The metal vias 970 may be provided in the interposer die 910. The metal vias 970 may be laterally spaced apart from each other. In an embodiment, the metal vias 970 may be provided to penetrate the interposer die 910 completely in a vertical direction.

The interposer interconnection layer 920 may be provided on the top surface of the interposer die 910. The interposer interconnection layer 920 may include a dielectric layer 921 and conductive structures 923. The dielectric layer 921 may include a plurality of layers. The dielectric layer 921 may be formed of or include a silicon-based insulating material. The conductive structures 923 may be provided in the dielectric layer 921. The conductive structures 923 may include wire portions and via portions. The via portions may be connected to the wire portions. The conductive structures 923 may be formed of or include at least one metallic material (e.g., copper, tungsten, titanium, and/or alloys thereof).

The interposer bonding pads 950 may be provided on a top surface of the interposer substrate 900. For example, the interposer bonding pads 950 may be provided on and coupled to the conductive structures 923. The conductive structures 923 may include a first conductive structure and a second conductive structure. The second conductive structure may be electrically separated from the first conductive structure. Two of the interposer bonding pads 950 may be electrically connected to each other through the first conductive structure. Another of the interposer bonding pads 950 may be electrically connected to one of the metal vias 970 through the second conductive structure. The electrical connection with the interposer substrate 900 may mean electrical connection with at least one of the conductive structures 923.

The chip stack 10 may be disposed on the top surface of the interposer substrate 900. The chip stack 10 may be substantially the same as the chip stack 10 described in the embodiment of FIG. 1A. In an embodiment, a plurality of chip stacks 10 may be provided, and in this case, the chip stacks 10 may be laterally spaced apart from each other. The number of the chip stack 10 may be variously changed. For example, the semiconductor package 1 may include one chip stack 10. The chip stack 10 may include the first semiconductor chip 100, the second semiconductor chip 200, the third semiconductor chip 300, and the first mold layer 400.

The chip stack 10 may be connected to the interposer substrate 900 in a direct bonding manner. For example, the first semiconductor chip 100 may be connected to the interposer substrate 900 in a direct bonding manner. The first conductive pads 150 and the interposer bonding pads 950 may be connected to each other in a direct bonding manner. There may be no observable interface between the first conductive pads 150 and the interposer bonding pads 950. A thermal expansion coefficient of the first interconnection patterns 125 may be greater than a thermal expansion coefficient of the first conductive pads 150 and a thermal expansion coefficient of the interposer bonding pads 950. Since the first interconnection patterns 125 are provided on the first conductive pads 150, the direct bonding structure between the first conductive pads 150 and the interposer bonding pads 950 may be well formed. The description that follows will refer to an example in which a single first conductive pad 150, a single interposer bonding pad 950, and a single first interconnection pattern 125 are provided, for convenience in description.

Since, as described with reference to FIG. 1B, the first thickness T1 is larger than 0.5 times the thickness T10 of the first conductive pad 150, the first interconnection pattern 125 may exert a sufficiently strong force on the first conductive pad 150 during the direct bonding process. Since the first thickness T1 is smaller than 1.5 times the thickness T10 of the first conductive pad 150, the first insulating layer 121 may not be delaminated from the first interconnection patterns 125. The first width W1 (FIG. 1B) may be larger than the width W10 of the bottom surface of the first conductive pad 150. Accordingly, the bottom surface of the first conductive pad 150 may be vertically overlapped with the first interconnection pattern 125.

A width of the interposer bonding pad 950 may be larger than a width of the first conductive pad 150. For example, a width of a top surface of the interposer bonding pad 950 may be larger than the width W10 of the bottom surface of the first conductive pad 150. Accordingly, in a process of disposing the chip stack 10, the first conductive pad 150 may be well coupled to the interposer bonding pad 950. The thickness T10 of the first conductive pad 150 may be smaller than a thickness T40 of the interposer bonding pad 950.

The dielectric layer 921 and the first insulating layer 121 may be connected to each other in a direct bonding manner. A chemical bond may be provided between the dielectric layer 921 and the first insulating layer 121.

The interposer bonding pads 950 may include a fourth barrier pad or a fourth barrier pad portion 950B and a fourth metal pad or a fourth metal pad portion 950M. The fourth barrier pad 950B may cover bottom and side surfaces of the fourth metal pad 950M. The fourth barrier pad 950B may be formed of or include at least one of tantalum and/or alloys thereof. For example, the fourth metal pad 950M may be formed of or include copper. A thermal expansion coefficient of the fourth metal pad 950M may range from 5 ppm/K to 18 ppm/K.

Each of the conductive structures 923 may further include a conductive pattern 922. The conductive pattern 922 may be in contact with a bottom surface of the interposer bonding pad 950 electrically connected thereto. A width of the conductive pattern 922 may be smaller than the width of the interposer bonding pad 950 electrically connected thereto.

As shown in FIG. 6A, the solder balls 500 may be provided on a bottom surface of the interposer substrate 900 and may be electrically connected to the metal vias 970. The solder balls 500 may be laterally spaced apart from each other and may be electrically separated from each other. The solder balls 500 may be formed of or include at least one of solder materials (e.g., tin, silver, zinc, and/or alloys thereof). The semiconductor package 1 may further include solder pads 905. The solder pads 905 may be interposed between the solder balls 500 and the metal vias 970. In an embodiment, the solder pads 905 may be formed of or include a material different from the solder ball 500. The solder pads 905 may be formed of or include at least one metallic material (e.g., copper, gold, or nickel).

The chip stack 10 may be electrically connected to the solder balls 500 and the fourth semiconductor chip 600 through the interposer substrate 900.

The fourth semiconductor chip 600 may be mounted on the interposer substrate 900. The fourth semiconductor chip 600 may be laterally spaced apart from the chip stack 10. For example, the fourth semiconductor chip 600 may be disposed between the chip stacks 10. The fourth semiconductor chip 600 may be of a different kind from the first to third semiconductor chips 100, 200, and 300. For example, the fourth semiconductor chip 600 may be a logic chip or a system-on-chip (SOC). As an example, the fourth semiconductor chip 600 may be a logic chip having a different function from the first semiconductor chip 100. The fourth semiconductor chip 600 may be an ASIC chip or an application processor (AP) chip. The fourth semiconductor chip 600 may include a central processing unit (CPU) or a graphics processing unit (GPU).

The fourth semiconductor chip 600 may include a fourth insulating layer 621, a fourth interconnection pattern 615, and a fourth bonding pad 650. The fourth insulating layer 621, the fourth interconnection pattern 615, and the fourth bonding pad 650 may be similar to the first insulating layer 121, the first interconnection pattern 125, and the first bonding pad 155, respectively, described with reference to FIGS. 1B and 6B. For example, a bottom surface of the fourth semiconductor chip 600 may include a bottom surface of the fourth insulating layer 621 and a bottom surface of the fourth bonding pad 650. The fourth insulating layer 621 may be provided in a lower portion of the fourth semiconductor chip 600. The fourth insulating layer 621 may be formed of or include a silicon-based insulating material. The fourth bonding pad 650 may be provided on the bottom surface of the fourth semiconductor chip 600. The fourth bonding pad 650 may be a chip pad. The fourth bonding pad 650 may be formed of or include, for example, copper.

The fourth interconnection pattern 615 may be provided in the fourth insulating layer 621. The fourth interconnection pattern 615 may be provided on the fourth bonding pad 650 and may be in contact with the fourth bonding pad 650. The fourth bonding pad 650 may be electrically connected to integrated circuits of the fourth semiconductor chip 600 through the fourth interconnection pattern 615. A thickness of the fourth interconnection pattern 615 may be 0.5 to 1.5 times a thickness of the fourth bonding pad 650. A width of the fourth interconnection pattern 615 may be larger than a width of the fourth bonding pad 650. A thermal expansion coefficient of the fourth interconnection pattern 615 may be greater than a thermal expansion coefficient of the fourth bonding pad 650. For example, the thermal expansion coefficient of the fourth interconnection pattern 615 may be greater than 18 ppm/K and may be smaller than or equal to 50 ppm/K. The thermal expansion coefficient of the fourth bonding pad 650 may range from 5 ppm/K to 18 ppm/K.

The fourth semiconductor chip 600 may be connected to the interposer substrate 900 in a direct bonding manner. For example, the fourth bonding pad 650 and the interposer bonding pad 950 corresponding thereto may be connected to each other in a direct bonding manner. There may be no observable interface between the fourth bonding pad 650 and the interposer bonding pad 950. Since the fourth interconnection pattern 615 is provided on the fourth bonding pad 650, the direct bonding structure between the fourth bonding pad 650 and the interposer bonding pad 950 may be well formed. The dielectric layer 921 and the fourth insulating layer 621 may be connected to each other in a direct bonding manner. A chemical bond may be provided between the dielectric layer 921 and the fourth insulating layer 621.

The fourth semiconductor chip 600 may be electrically connected to the solder balls 500 through the interposer substrate 900.

The semiconductor package 1 may further include a second mold layer 420. The second mold layer 420 may be provided on the interposer substrate 900 to cover or surround side surfaces of the chip stack 10 and side surfaces of the fourth semiconductor chip 600. The second mold layer 420 may be provided to expose the top surface of the chip stack 10 and the top surface of the fourth semiconductor chip 600. The second mold layer 420 may be formed of or include an insulating polymer (e.g., an epoxy-based molding compound).

Figure 6C:
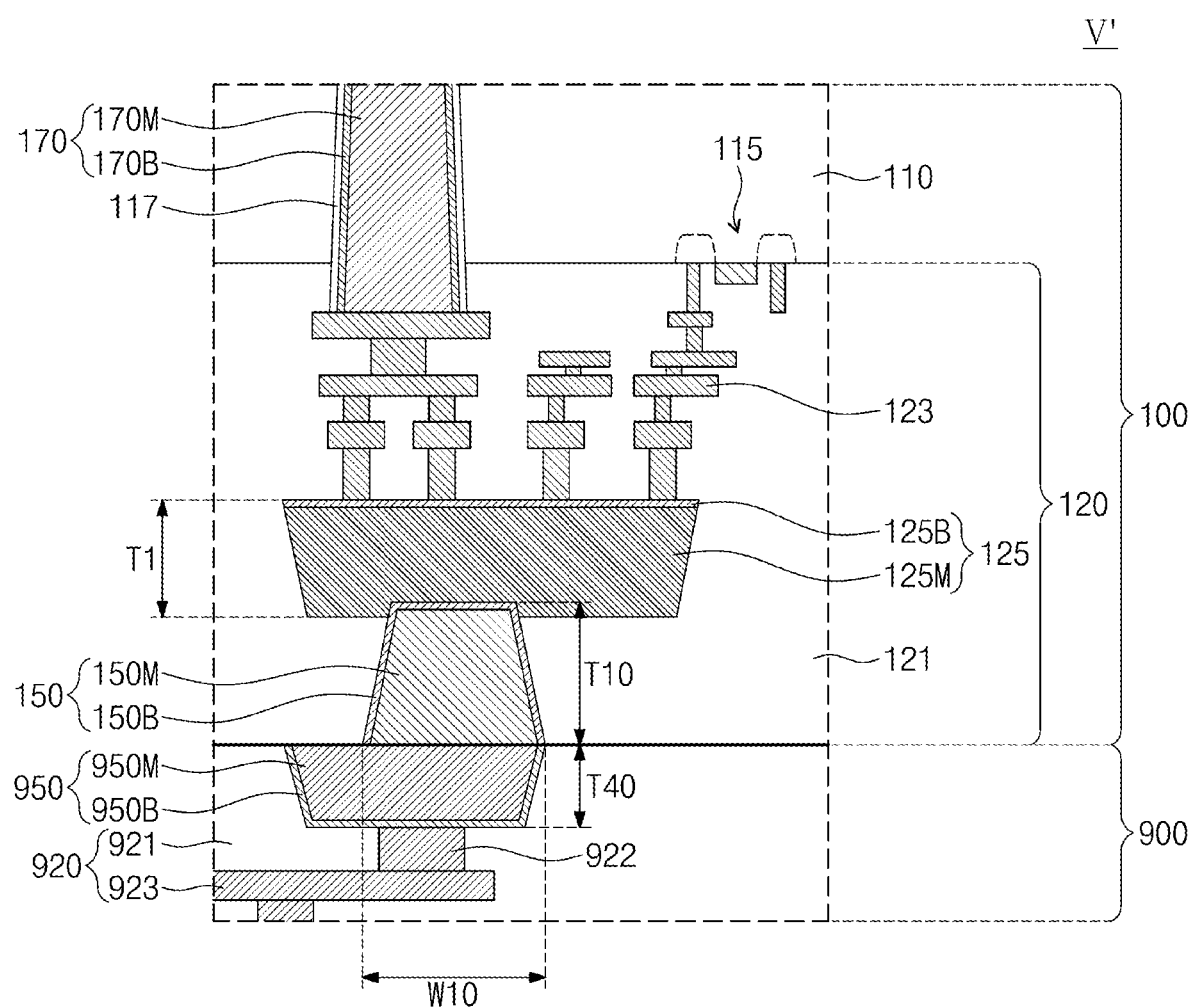
FIG. 6C is a diagram illustrating a direct bonding structure between a first semiconductor chip and an interposer substrate, according to an embodiment of the inventive concept.

FIG. 6C is a diagram illustrating a direct bonding structure between a first semiconductor chip and an interposer substrate, according to an embodiment of the inventive concept, and is an enlarged sectional view illustrating the portion V of FIG. 6A. Hereinafter, the present embodiment will be described with reference to FIG. 6C, in conjunction with FIG. 6A.

Referring to FIG. 6C, the first conductive pad 150 and the interposer bonding pad 950 may be connected to each other in a direct bonding manner. However, the first conductive pad 150 may include a protruding portion that is partially inserted into the first interconnection pattern 125. A top surface of the first conductive pad 150 may be provided at a level higher than a bottom surface of the first interconnection pattern 125. Here, the bottom surface of the first interconnection pattern 125 may be covered with the first insulating layer 121.

Figure 7:
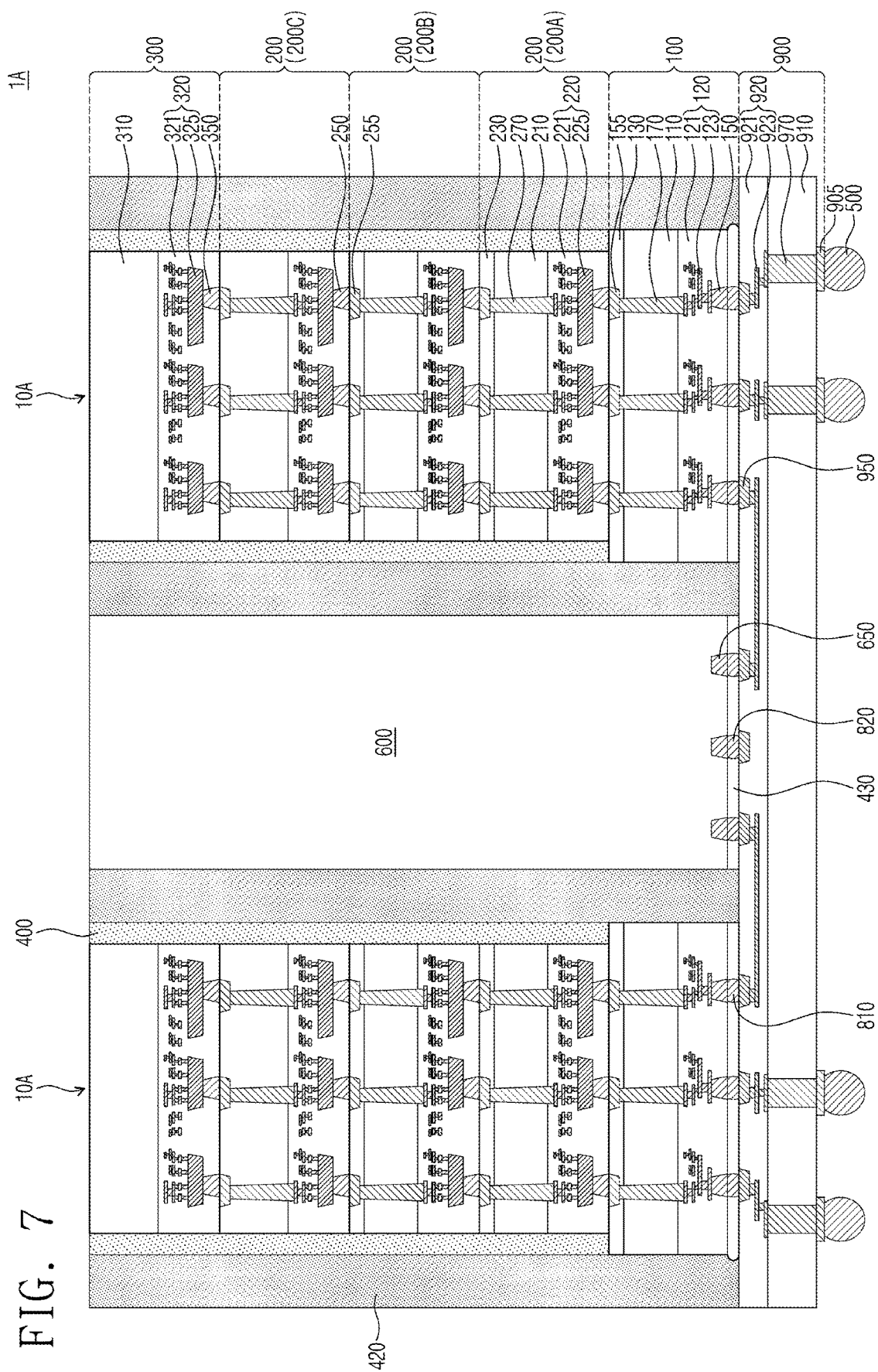
FIG. 7 is a diagram illustrating a semiconductor package according to an embodiment of the inventive concept.

FIG. 7 is a diagram illustrating a semiconductor package according to an embodiment of the inventive concept. For concise description, a previously described element may be identified by the same reference number without repeating an overlapping description thereof.

Referring to FIG. 7, the semiconductor package 1A may include the interposer substrate 900, the solder balls 500, the chip stack 10A, and the fourth semiconductor chip 600. The chip stack 10A may be substantially the same as that in the embodiments of FIGS. 5A and 5B. For example, the first semiconductor chip 100 may not include the first interconnection pattern 125.

The semiconductor package 1A may further include first bumps 810, second bumps 820, and an under-fill layer 430. The first bumps 810 may be interposed between the interposer substrate 900 and the first semiconductor chip 100. The first bumps 810 may be coupled to the interposer bonding pads 950 and the first bonding pads 155. The first bumps 810 may include at least one of solder balls and metal pillars.

The second bumps 820 may be interposed between the interposer substrate 900 and the fourth semiconductor chip 600. The fourth semiconductor chip 600 may include a plurality of fourth bonding pads 650. The second bumps 820 may be coupled to the fourth bonding pads 650 and the interposer bonding pads 950. The second bumps 820 may include at least one of solder balls and metal pillars.

The under-fill layer 430 may be interposed between the interposer substrate 900 and the first semiconductor chip 100 to hermetically seal the first bumps 810. The under-fill layer 430 may be further extended into a gap region between the interposer substrate 900 and the fourth semiconductor chip 600 to hermetically seal the second bumps 820. The under-fill layer 430 may be formed of or include an insulating polymer.

According to an embodiment of the inventive concept, a first semiconductor chip may include a first bonding pad provided on a top surface thereof. A second semiconductor chip may be provided on the first semiconductor chip. The second semiconductor chip may include a second interconnection pattern and a second bonding pad. The second bonding pad may be directly bonded to the first bonding pad. The second interconnection pattern may be provided on a top surface of a second bonding pad. The second interconnection pattern may be configured to exert a force on the first and second bonding pads, during a process of directly bonding the first bonding pad to the second bonding pad. Accordingly, it may be possible to form a good direct bonding structure between the first and second bonding pads. As a result, it may be possible to improve electrical characteristics between the first and second semiconductor chip and reliability characteristics of a semiconductor package.

While example embodiments of the inventive concept have been particularly shown and described, it will be understood by one of ordinary skill in the art that variations in form and detail may be made therein without departing from the scope of the attached claims.

What is claimed is:

1. A semiconductor package, comprising:
   a first semiconductor chip; and
   a second semiconductor chip on a top surface of the first semiconductor chip,
   wherein the first semiconductor chip comprises:
      a first semiconductor substrate;
      a first bonding pad on a top surface of the first semiconductor substrate; and
      a first penetration via on a bottom surface of the first bonding pad and penetrating the first semiconductor substrate,
   the second semiconductor chip comprises:
      a second semiconductor substrate;
      a second interconnection pattern on a bottom surface of the second semiconductor substrate; and
      a second bonding pad on a bottom surface of the second interconnection pattern and coupled to the second interconnection pattern,
   the second bonding pad is directly bonded to the first bonding pad,
   a width of the first penetration via is smaller than a width of the first bonding pad,
   a width of the second interconnection pattern is larger than a width of the second bonding pad,
   the second interconnection pattern is in contact with a top surface of the second bonding pad, and
   the first penetration via is in contact with the bottom surface of the first bonding pad.

2. The semiconductor package of claim 1, wherein the first bonding pad comprises:
   a first top surface portion in contact with the second bonding pad, and
   a second top surface portion not in contact with the second bonding pad.

3. The semiconductor package of claim 1, wherein the width of the first bonding pad is larger than the width of the second bonding pad, and
   a thickness of the first bonding pad is smaller than a thickness of the second bonding pad.

4. The semiconductor package of claim 1, wherein an angle between a bottom surface and a side surface of the second bonding pad is an acute angle, and
   an angle between the bottom surface and a side surface of the second interconnection pattern is an obtuse angle.

5. The semiconductor package of claim 1, wherein a thickness of the second interconnection pattern is 0.5 to 1.5 times a thickness of the second bonding pad.

6. The semiconductor package of claim 1, wherein a thermal expansion coefficient of the second interconnection pattern is greater than a thermal expansion coefficient of the second bonding pad.

7. The semiconductor package of claim 1, wherein the second interconnection pattern comprises:
   a metal line; and
   a barrier pattern on a top surface of the metal line,
   wherein the second bonding pad comprises:
      a metal pad; and
      a barrier pad covering a bottom surface and a side surface of the metal pad, and
   the metal line comprises a metallic element different from that of the metal pad.

8. The semiconductor package of claim 7, wherein the metal pad comprises copper, and
   the metal line comprises aluminum, tin, and/or zinc.

9. The semiconductor package of claim 1, further comprising a third semiconductor chip on a top surface of the second semiconductor chip,
   wherein the second semiconductor chip comprises:
      a second penetration via penetrating the second semiconductor substrate; and
      a second upper bonding pad on a top surface of the second penetration via,
   the third semiconductor chip comprises:
      a third semiconductor substrate;
      a third interconnection pattern on a bottom surface of the third semiconductor substrate; and
      a third bonding pad on a bottom surface of the third interconnection pattern and coupled to the third interconnection pattern, the third bonding pad is directly bonded to the second upper bonding pad, and a width of the third interconnection pattern is larger than a width of the third bonding pad.

10. The semiconductor package of claim 9, wherein a width of the second penetration via is smaller than a width of the second upper bonding pad.

11. A semiconductor package, comprising:
a first substrate;
a first pad on a top surface of the first substrate;
a first conductive pattern in contact with a bottom surface of the first pad; and
a semiconductor chip on the top surface of the first substrate,
wherein the semiconductor chip comprises:
a semiconductor substrate;
an interconnection layer on a bottom surface of the semiconductor substrate,
the interconnection layer comprising an interconnection pattern; and
a bonding pad coupled to a bottom surface of the interconnection pattern,
the bonding pad is directly bonded to the first pad,
a width of the interconnection pattern is larger than a width of the bonding pad, and
a width of the first conductive pattern is smaller than a width of the first pad.

12. The semiconductor package of claim 11, wherein the interconnection layer further comprises an insulating layer,
a top surface of the first pad comprises:
a first top surface portion in contact with the bonding pad; and
a second top surface portion in contact with the insulating layer.

13. The semiconductor package of claim 11, wherein an angle between a bottom surface and a side surface of the bonding pad is an acute angle, and
an angle between the bottom surface and a side surface of the interconnection pattern is an obtuse angle.

14. The semiconductor package of claim 11, wherein the first substrate comprises an interposer die, and
the first pad comprises an interposer pad.

15. The semiconductor package of claim 11, further comprising integrated circuits on a bottom surface of the first substrate,
wherein the first conductive pattern comprises a first penetration via penetrating the first substrate.

16. The semiconductor package of claim 11, wherein the interconnection pattern is in contact with a top surface of the bonding pad, and
the first conductive pattern is in contact with the bottom surface of the first pad.

17. A semiconductor package, comprising:
a first semiconductor chip; and
a second semiconductor chip on a top surface of the first semiconductor chip,
wherein the first semiconductor chip comprises:
a first semiconductor substrate;
first integrated circuits on a bottom surface of the first semiconductor substrate;
a first interconnection layer on the bottom surface of the first semiconductor substrate, the first interconnection layer comprising a first insulating layer and a first interconnection structure;
a first back-side insulating layer on a top surface of the first semiconductor substrate;
a first penetration via in the first semiconductor substrate and electrically connected to the first interconnection structure; and
a first bonding pad on a top surface of the first penetration via and in the first back-side insulating layer and coupled to the first penetration via,
the second semiconductor chip comprises:
a second semiconductor substrate;
second integrated circuits on a bottom surface of the second semiconductor substrate;
a second interconnection layer on the bottom surface of the second semiconductor substrate, the second interconnection layer comprising a second insulating layer, a second interconnection structure, and a second interconnection pattern; and
a second bonding pad in contact with a bottom surface of the second interconnection pattern,
the second bonding pad is directly bonded to the first bonding pad,
the second insulating layer is directly bonded to the first back-side insulating layer,
a width of the bottom surface of the second interconnection pattern is larger than a width of a bottom surface of the second bonding pad, and
a width of a top surface of the first bonding pad is larger than a width of the first penetration via.

18. The semiconductor package of claim 17, wherein the width of the top surface of the first bonding pad is larger than the width of the bottom surface of the second bonding pad, and
a thickness of the first bonding pad is smaller than a thickness of the second bonding pad.

19. The semiconductor package of claim 17, wherein the width of the bottom surface of the second bonding pad is larger than a width of a top surface of the second bonding pad, and
the width of the bottom surface of the second interconnection pattern is smaller than a width of a top surface of the second interconnection pattern.

20. The semiconductor package of claim 17, wherein the second interconnection pattern has a thermal expansion coefficient that is greater than that of the second bonding pad, and
a thickness of the second interconnection pattern is 0.5 to 1.5 times a thickness of the second bonding pad.

* * * * *